(12) United States Patent
Lee et al.

(10) Patent No.: US 10,916,592 B2
(45) Date of Patent: Feb. 9, 2021

(54) ORGANIC LIGHT-EMITTING DIODE DISPLAY DEVICE

(71) Applicant: Samsung Display Co., Ltd., Yongin-si (KR)

(72) Inventors: Eon Joo Lee, Hwaseong-si (KR); Hyoeng Ki Kim, Suwon-si (KR); Jun Hyuk Woo, Yongin-si (KR); Kwang Woo Park, Hwaseong-si (KR); Hyeon Bum Lee, Hwaseong-si (KR); Jin Whan Jung, Yesan-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/402,307

(22) Filed: May 3, 2019

(65) Prior Publication Data
US 2019/0341428 A1 Nov. 7, 2019

(30) Foreign Application Priority Data

May 3, 2018 (KR) .................. 10-2018-0051051

(51) Int. Cl.
| | | |
|---|---|---|
| *H01L 27/32* | (2006.01) | |
| *H01L 51/52* | (2006.01) | |
| *H01L 51/50* | (2006.01) | |

(52) U.S. Cl.
CPC .......... *H01L 27/322* (2013.01); *H01L 27/323* (2013.01); *H01L 27/3211* (2013.01); *H01L 27/3276* (2013.01); *H01L 51/5036* (2013.01); *H01L 51/5256* (2013.01)

(58) Field of Classification Search
CPC . H01L 27/322; H01L 27/323; H01L 51/5036; H01L 51/5256; H01L 27/3276; H01L 27/3211; H01L 27/3216
See application file for complete search history.

(56) References Cited

U.S. PATENT DOCUMENTS

| | | | |
|---|---|---|---|
| 2004/0007973 A1* | 1/2004 | Utsumi | ............. G02F 1/136209 313/506 |
| 2014/0027724 A1* | 1/2014 | Lim | ...................... H01L 27/322 257/40 |
| 2014/0175399 A1* | 6/2014 | Choi | ....................... H01L 51/56 257/40 |
| 2015/0137101 A1 | 5/2015 | Choi et al. | |
| 2015/0331508 A1* | 11/2015 | Nho | ...................... H01L 27/323 345/173 |

(Continued)

FOREIGN PATENT DOCUMENTS

| | | |
|---|---|---|
| KR | 10-0904520 | 6/2009 |
| KR | 10-2014-0014685 | 2/2014 |

(Continued)

*Primary Examiner* — Rodney Amadiz
(74) *Attorney, Agent, or Firm* — H.C. Park & Associates, PLC

(57) ABSTRACT

An organic light-emitting diode display device includes a substrate having a plurality of pixels; first electrodes disposed on the substrate, each of which is connected to a respective one of the pixels; organic emissive layers disposed on the first electrodes; a second electrode disposed on the organic emissive layers; a touch sensing unit disposed on the second electrode; and color filters disposed on the touch sensing unit, each of which is disposed above a respective one of the pixels.

19 Claims, 17 Drawing Sheets

(56) References Cited

U.S. PATENT DOCUMENTS

2017/0271312 A1    9/2017  Kwon
2017/0277288 A1*   9/2017  Choi .................. H01L 51/0097
2018/0348907 A1*  12/2018  Lee ...................... G06F 3/0412
2018/0350885 A1*  12/2018  Choi .................. H01L 51/5221

FOREIGN PATENT DOCUMENTS

KR    10-2015-0057075    5/2015
KR    10-2017-0109183    9/2017
KR    10-2017-0114223    10/2017

* cited by examiner

ORGANIC LIGHT-EMITTING DIODE DISPLAY DEVICE

CROSS REFERENCE TO RELATED APPLICATION

This application claims priority from and the benefit of Korean Patent Application No. 10-2018-0051051, filed on May 3, 2018, which is hereby incorporated by reference for all purposes as if fully set forth herein.

BACKGROUND

Field

Exemplary implementations of the invention relate generally to an organic light-emitting diode display device, and, more particularly to an organic light-emitting diode display device that reduces white angle dependency (WAD) phenomenon.

Discussion of the Background

Display devices have become more and more important as multimedia technology evolves. Accordingly, a variety of types of display devices such as liquid-crystal display (LCD) devices and organic light-emitting display (OLED) devices are currently used.

Among display devices, an organic light-emitting diode display device displays images by using an organic light-emitting element that emits light as electrons and holes recombine. An organic light-emitting diode display device may include color filters for reducing reflection of external light. Such an organic light-emitting diode display device has advantages in that it has fast response speed, high luminance and large viewing angle, and is driven with low power.

Light coming from the organic light emitting element is emitted to the outside through an upper substrate or a lower substrate. Due to the difference in refractive index between a light emitting layer of the organic light emitting element and a light transmitting surface, the efficiency of light extraction may be reduced at or above a certain viewing angle or greater with respect to the front of the display. In particular, since short-wavelength light is greatly affected by viewing angle, a white angular dependency (WAD) phenomenon in which color and luminance change according to viewing angle may occur. The WAD phenomenon degrades the quality of a displayed image.

The above information disclosed in this Background section is only for understanding of the background of the inventive concepts, and, therefore, it may contain information that does not constitute prior art.

SUMMARY

Organic light-emitting diode (OLED) display devices constructed according to exemplary implementations of the invention are capable of reducing white angle dependency (WAD).

According to the principles and exemplary embodiments of the invention, Applicant discovered that providing uneven surface patterns on certain components of an OLD display device, such as color filters having uneven on a touch sensing unit, improves reflection of external light and reduces the WAD.

Additional features of the inventive concepts will be set forth in the description which follows, and in part will be apparent from the description, or may be learned by practice of the inventive concepts.

According to one or more embodiments of the invention an organic light-emitting diode display device includes a substrate having a plurality of pixels; first electrodes disposed on the substrate, each of which is connected to a respective one of the pixels; organic emissive layers disposed on the first electrodes; a second electrode disposed on the organic emissive layers; a touch sensing unit disposed on the second electrode; and color filters disposed on the touch sensing unit, each of which is disposed above a respective one of the pixels.

The color filters might have upper uneven surfaces having concave portions and convex portions.

The concave portions might be at the same level with respect to reference surface of the color filters, and wherein the convex portions might protrude from the reference surface of the color filters in a thickness direction.

The uneven surfaces might include patterns of islands separated from one another, and wherein each of the island patterns has a dot shape.

The uneven surfaces might include one or more closed shapes.

The convex portions might be at the same level with respect to a reference surface of the color filters, and wherein the concave portions might be recessed from the reference surface of the color filters in a thickness direction.

The color filters might include upper and lower surfaces, at least one of which is uneven.

The touch sensing unit might include a touch electrode layer and an insulating layer covering the touch electrode layer, and wherein an upper surface of the insulating layer might include an uneven pattern that contacts with lower surfaces of the color filters.

The organic light-emitting diode display device might further include at least one uneven color pattern disposed on upper surfaces of the color filters, wherein the upper surfaces of the color filters might include first portions in which the uneven color pattern is disposed, and second portions that are exposed and substantially flat.

The organic light-emitting diode display device might further include a black matrix disposed along boundaries between the color filters, wherein the touch sensing unit might include a touch electrode layer having a metal mesh, and wherein the metal mesh overlaps with the black matrix in a thickness direction.

The touch sensing unit might include a touch electrode layer and an insulating layer covering the touch electrode layer.

The lower surfaces of the color filters might contact an upper surface of the insulating layer.

The touch sensing unit might include a touch electrode layer, and wherein the color filters are disposed directly on the touch electrode layer.

The upper surfaces of the color filters might be uneven.

The organic light-emitting diode display device might further include an encapsulation layer disposed on the second electrode, wherein the touch sensing unit might include a touch electrode layer disposed directly on the encapsulation layer.

The organic light-emitting diode display device might further include an encapsulation layer disposed on the second electrode; and an insulating layer disposed on the encapsulation layer, wherein the touch sensing unit might include a touch electrode layer disposed directly on the insulating layer.

The second electrode might include concave portions, convex portions protruding upward from the concave portions, and inclined portions connecting the concave portions with the convex portions.

The organic light-emitting diode display device might further include a protective layer disposed between the substrate and the first electrodes and having concave portions and convex portions on an upper surface thereof.

The concave portions, the convex portions and the inclined portions of the second electrode might have substantially the same thicknesses.

According to one or more embodiments of the invention an organic light-emitting diode display device includes a substrate; an organic light-emitting element disposed on the substrate; an insulating layer covering the organic light-emitting element; a touch electrode layer disposed on the insulating layer; and color filters covering the touch electrode layer, wherein the color filters contact with the touch electrode layer and comprise a pattern of protrusions or recesses on at least one surface thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
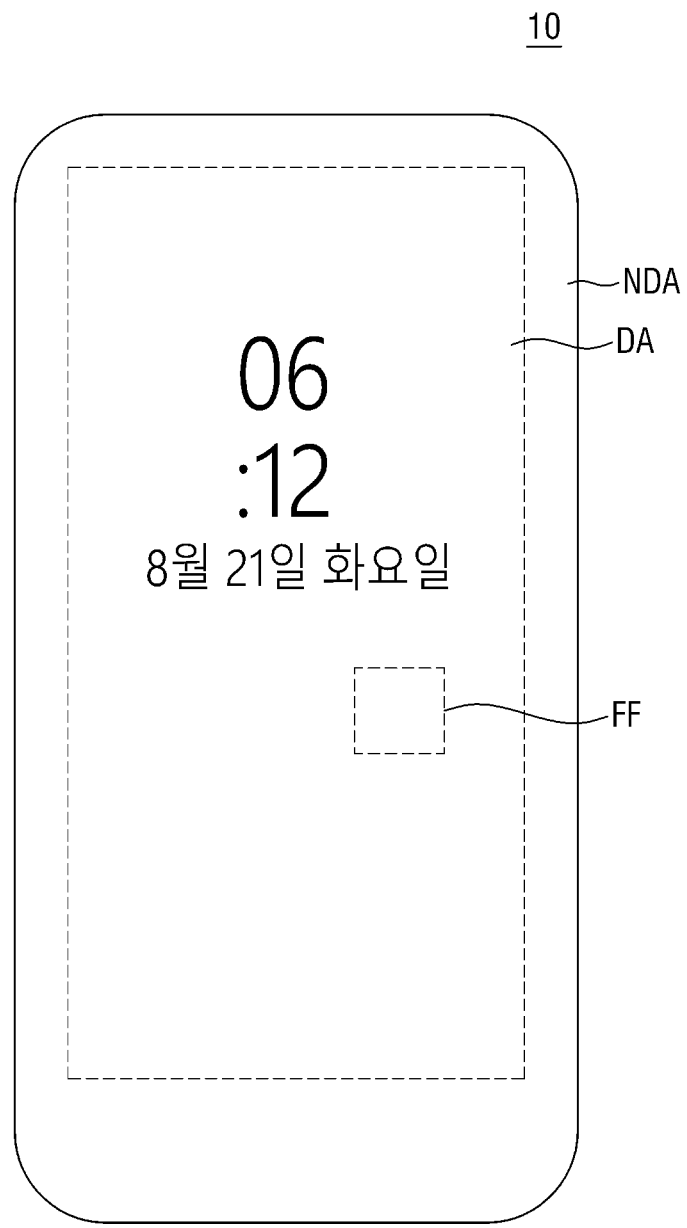
FIG. 1 is a plan view of an organic light-emitting diode display device implemented as a smart phone constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An organic light-emitting diode display device is a type of display devices for displaying moving image or still image, and includes an organic light-emitting element. An organic light-emitting diode display device may be applied to any portable electronic device such as a mobile communications terminal, a smart phone, a tablet PC, a smart watch and a navigation device, as well as a larger device such as a television, a laptop computer, a monitor, an electronic billboard, and a device for the Internet of Things.

Hereinafter, exemplary embodiments of the invention will be described in detail with reference to the accompanying drawings. The same or similar elements are herein designated by like reference numerals.

FIG. 1 is a plan view of an organic light-emitting diode display device implemented as a smart phone constructed according to an exemplary embodiment of the invention.

Referring to FIG. 1, an organic light-emitting diode display device 10 implemented as a smart phone may include a display area DA and a non-display area NDA.

The display area DA is defined as an area for displaying images. In the display area DA, there may be elements for displaying images, as well as a detecting element for detecting an external environment. In other words, the display area DA may be used as an area for displaying images and also as an area for recognizing a touch input or a user's fingerprint.

In an exemplary embodiment, the display area DA may have a substantially flat shape. It is, however, to be understood that the invention is not limited thereto. For example, the display area DA may be bent at least partially.

The non-display area NDA is defined as an area where no image is displayed. The non-display area NDA is disposed on the outer side of the display area DA. The non-display area NDA may surround the display area DA. In an exemplary embodiment, a speaker module, a camera module, a sensor module, and the like may be disposed in the non-display area NDA. In an exemplary embodiment, the sensor module may include at least one of an illuminance sensor, a proximity sensor, an infrared sensor, and an ultrasonic sensor.

Figure 2:
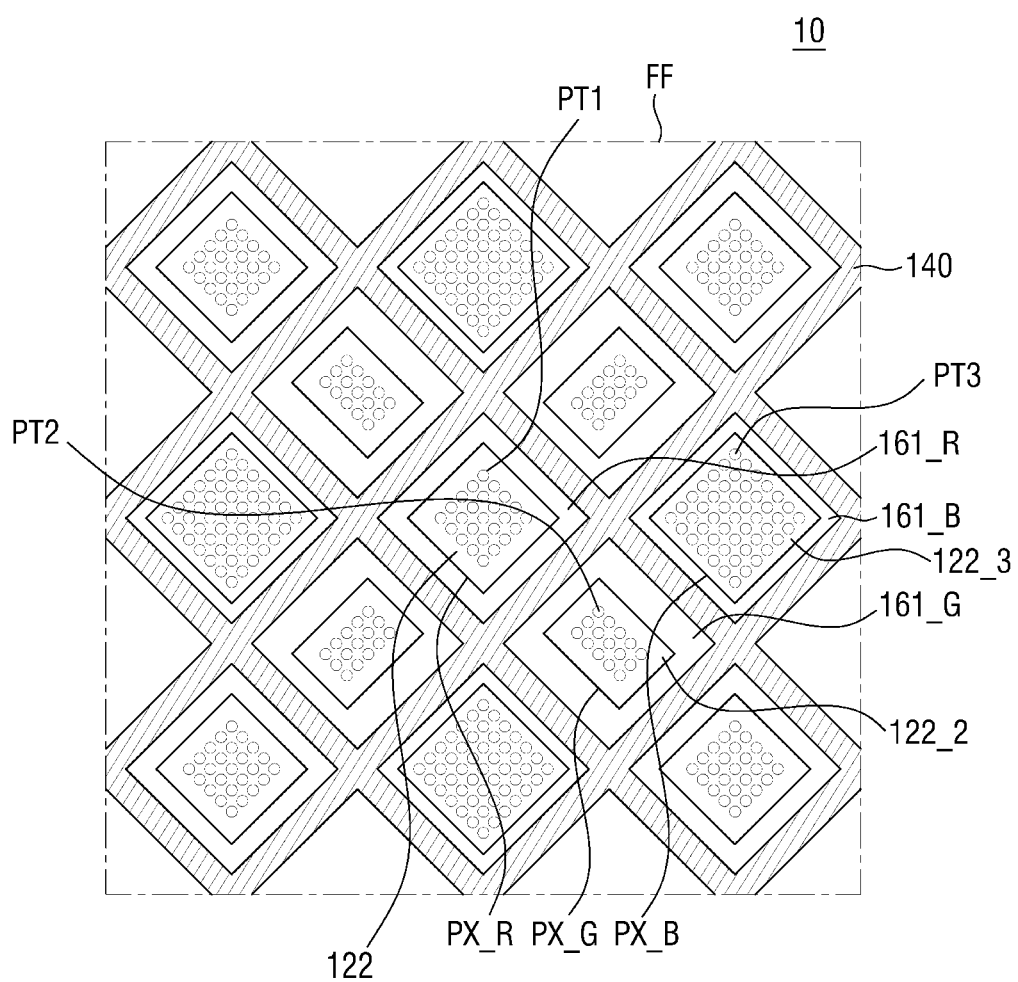
FIG. 2 is an enlarged view showing the layout of portion FF of FIG. 1.

FIG. 2 is an enlarged view showing the layout of portion FF of FIG. 1.

Referring to FIG. 2, the organic light-emitting diode display device 10 includes a plurality of pixels PX_R, PX_G and PX_B arranged in a matrix. The plurality of pixels PX_R, PX_G and PX_B may be a plurality of color pixels. For example, the plurality of pixels may include a red pixel PX_R, a green pixel PX_G, and a blue pixel PX_B. In addition, the plurality of pixels may further include a white pixel. In other exemplary embodiments, cyan, magenta and yellow pixels may be provided, instead of the red, green and blue pixels. In the following description, an example in which the organic light-emitting diode display device 10 includes red, green and blue pixels PX_R, PX_G and PX_B will be described.

The red, green and blue pixels PX_R, PX_G and PX_B may be arranged in a repeated sequence. Each of the pixels PX_R, PX_G and PX_B may have a rectangular shape. In an exemplary embodiment, each of the pixels PX_R, PX_G and PX_B may be disposed in a diamond shape, whose sides are inclined with respect to the longer sides and the shorter sides of the organic light-emitting diode display device 10. It is, however, to be understood that the invention is not limited thereto. For example, each of the pixels PX_R, PX_G and PX_B may be disposed in a rectangular or square shape.

The sizes of the pixels PX_R, PX_G and PX_B may be different from each other. For example, the blue pixel PX_B may be larger than the red pixel PX_R, and the red pixel PX_R may be larger than the green pixel PX_G. It is to be noted that the relative sizes of the pixels PX_R, PX_G and PX_B are not limited thereto.

Each of the pixels PX_R, PX_G and PX_B include an organic emissive layer 122 and color filters 161_R, 161_G and 161_B, respectively. In an exemplary embodiment, the first color filter 161_R may be a red color filter, the second color filter 161_G may be a green color filter, and the third color filter 161_B may be a blue color filter. The red pixel PX_R may include a red organic emissive layer 122_1 and a red first color filter 161_R. The green pixel PX_G may include a green organic emissive layer 122_2 and a green second color filter 161_G. The blue pixel PX_B may include a blue organic emissive layer 122_3 and a blue third color filter 161_B. In another exemplary embodiment, each of the red, green and blue pixels PX_R, PX_G and PX_B may include a white organic emissive layer and the respective color filter. The white organic emissive layer may be formed by stacking two or more organic emissive layers.

The color filters 161_R, 161_G and 161_B include color patterns of protrusions PT1, PT2, and PT3, respectively. As shown in the drawings, the color filters 161_R, 161_G and 161_B may include color patterns of protrusions PT1, PT2 and PT3 each formed of a set of dots. Herein, a dot may refer to a circle having a diameter. It is to be noted that the shapes of the color patterns of protrusions PT1, PT2, and PT3 are not limited to dots, and may have various other shapes, such as ellipses and polygons, that form an uneven surface.

The pixels PX_R, PX_G and PX_B may have different numbers of the color patterns of protrusions PT1, PT2, and PT3. For example, the number of protrusions of the color pattern PT3 included in the blue pixel PX_B may be greater than the number of protrusions of the color pattern PT1 included in the red pixel PX_R. For example, the number of protrusions of the color pattern PT1 included in the red pixel PX_R may be greater than the number of protrusions of the color pattern PT2 included in the green pixel PX_G.

A black matrix 140 is disposed at the boundary between the pixels. The black matrix 140 may have a lattice shape to define each of the pixels PX_R, PX_G, and PX_B.

Figure 3:
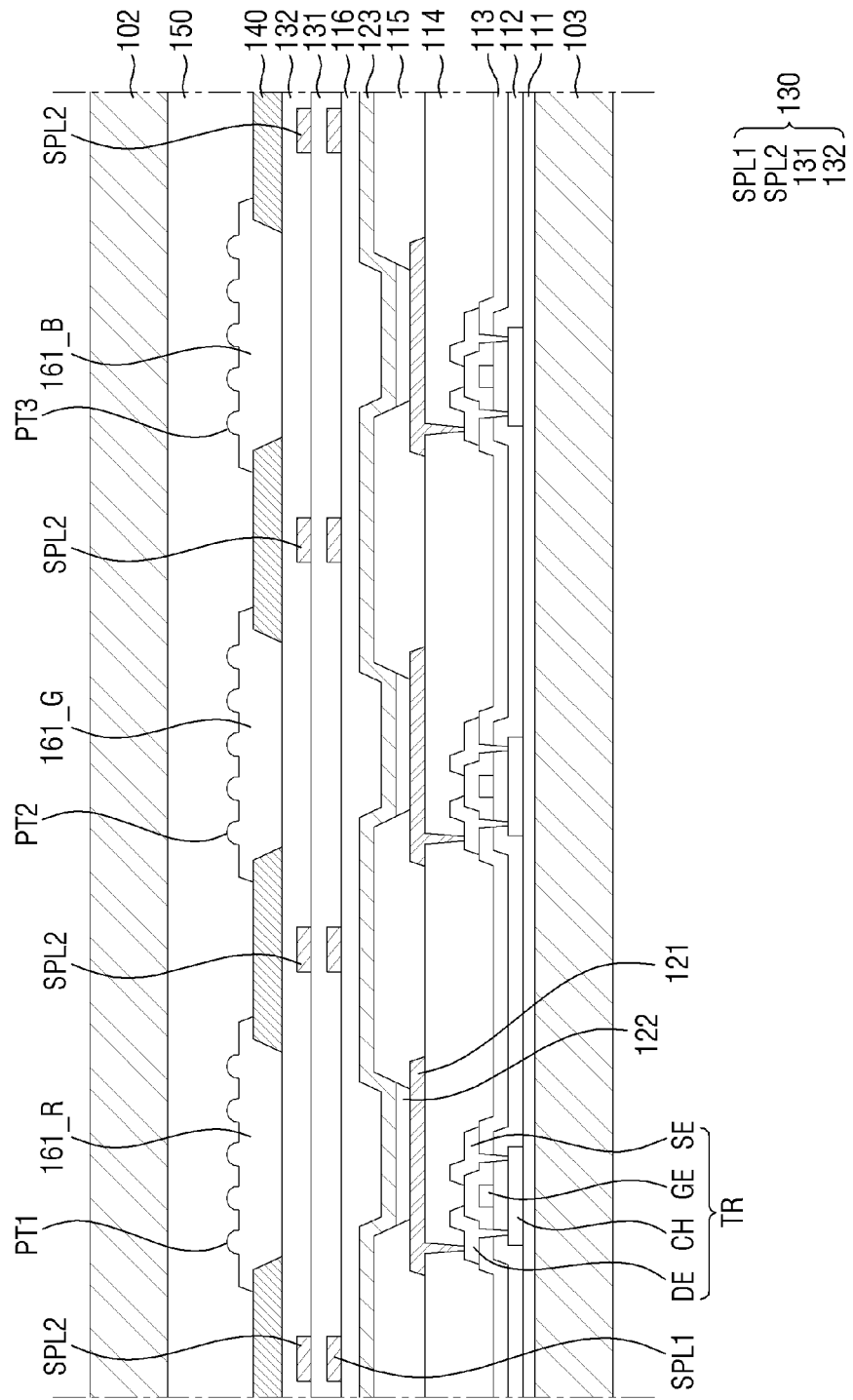
FIG. 3 is a cross-sectional view of an organic light-emitting diode display device constructed according to an exemplary embodiment of the invention.

The organic light-emitting diode display device 10 may further include a touch sensing unit 130 (see FIG. 3). The touch sensing unit 130 may be disposed between the organic emissive layers 122 and the color filters 161_R, 161_G and 161_B. The touch sensing unit 130 will be described in detail with reference to FIGS. 3 and 4.

Hereinafter, the cross-sectional structure of the organic light-emitting diode display device 10 described above with reference to FIG. 3 will be described in detail.

FIG. 3 is a cross-sectional view of the organic light-emitting diode display device constructed according to the exemplary embodiment of the invention.

The organic light-emitting diode display device 10 includes at least one base substrate. For example, the organic light-emitting diode display device 10 may include a first substrate 103 and a second substrate 102 opposing the first substrate 103. It is, however, to be understood that the invention is not limited thereto. The second substrate 102 may be eliminated or replaced with another structure such as a film or a layer.

The first substrate 103 may be a flexible substrate. For example, the first substrate 103 may be a film substrate including a polymer organic substance or a plastic substrate. For example, the first substrate 103 may be formed of a material selected from the group consisting of: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In addition, the first substrate 103 may include fiberglass reinforced plastic (FRP). It is, however, to be understood that the invention is not limited thereto. For example, the first substrate 103 may be a rigid substrate. Herein, the first substrate 103 may be one of a glass substrate, a quartz substrate, a glass ceramic substrate, and a crystalline glass substrate.

A buffer layer 111 is disposed on the first substrate 103. The buffer layer 111 provides a substantially flat surface over the first substrate 103 and prevents the permeation of moisture or external air. The buffer layer 111 may be an inorganic layer. The buffer layer 111 may be made up of a single layer or multiple layers.

On the buffer layer 111, a plurality of thin-film transistors TR is disposed. The plurality of thin-film transistors TR may be driving thin-film transistors. At least one thin-film transistor TR may be disposed in each of the pixels. Each of the thin-film transistors TR may include a semiconductor layer CH, a gate electrode GE, a source electrode SE, and a drain electrode DE.

More specifically, the semiconductor layer CH is disposed on the buffer layer 111. The semiconductor layer CH may include amorphous silicon, poly silicon, and an organic semiconductor. In another exemplary embodiment, the semiconductor layer CH may be an oxide semiconductor. The semiconductor layer CH may include a channel region, and a source region and a drain region which are disposed on the sides of the channel region, respectively, and are doped with impurities.

A gate insulating layer 112 is disposed on the semiconductor layer CH. The gate insulating layer 112 may be an inorganic layer. The gate insulating layer 112 may be made up of a single layer or multiple layers.

The gate electrode GE is disposed on the gate insulating layer 112. The gate electrode GE may be made of a conductive metal material. For example, the gate electrode GE may include molybdenum (Mo), aluminum (Al), copper (Cu), and titanium (Ti). The gate electrode GE may be a single layer or a multiple layer.

An interlayer dielectric layer 113 is disposed on the gate electrode GE. The interlayer dielectric layer 113 may be an inorganic layer. The interlayer dielectric layer 113 may be made up of a single layer or multiple layers.

On the interlayer dielectric layer 113, the source electrode SE and the drain electrode DE are disposed. The source electrode SE and the drain electrode DE are made of a conductive metal material. For example, the source electrode SE and the drain electrode DE may include aluminum (Al), copper (Cu), titanium (Ti), and molybdenum (Mo).

The source electrode SE and the drain electrode DE may be electrically connected to the source region and the drain region of the semiconductor layer CH, respectively, through a contact hole formed through the interlayer dielectric layer 113 and the gate insulating layer 112.

The organic light-emitting diode display device 10 may further include a storage capacitor and a switching thin-film transistor on the first substrate 103.

A protective layer 114 is disposed over the source electrode SE, the drain electrode DE, and the interlayer dielectric layer 113. The protective layer 114 is disposed to cover pixel circuitry including the thin-film transistor TR. The protective layer 114 may be a passivation layer or a planarizing layer. The passivation layer may include $SiO_2$, SiNx, etc., and the planarization layer may include materials such as acrylic and polyimide. The protective layer 114 may include both the passivation layer and the planarization layer. Then, the passivation layer may be disposed over the source electrode SE, the drain electrode DE and the interlayer dielectric layer 113, and the planarization layer may be disposed on the passivation layer.

Figure 10:
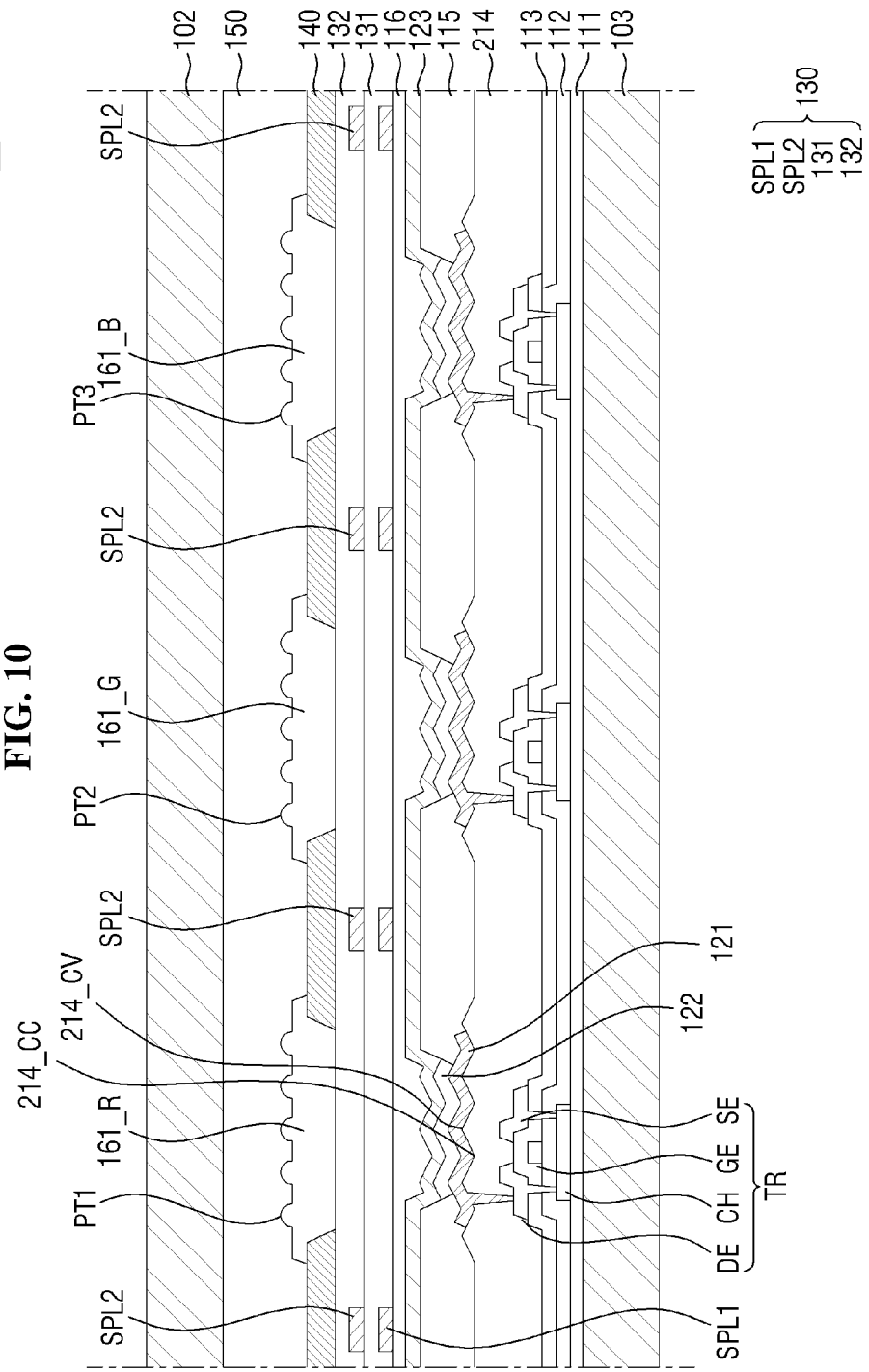
FIG. 10 is a cross-sectional view of an organic light-emitting diode display device constructed according to yet another exemplary embodiment of the invention.

The upper surface of the protective layer 114 may be substantially flat. It is, however, to be understood that the invention is not limited thereto. The upper surface of the protective layer 114 may not be flat as shown in FIG. 10. A detailed description thereon will be given later.

A plurality of first electrodes 121 may be disposed on the protective layer 114. The first electrodes 121 may be pixel electrodes each disposed in one of the respective pixels. In addition, each of the first electrodes 121 may be an anode electrode of an organic light-emitting diode.

The first electrodes 121 may be electrically connected to the drain electrode DE or the source electrode SE disposed on the first substrate 103 through a via hole passing through the passivation layer 114.

The first electrodes 121 may include a material having a high work function. The first electrodes 121 may include indium-tin-oxide (ITO), indium-zinc-oxide (IZO), zinc oxide (ZnO), indium oxide ($In_2O_3$), etc. The above-listed conductive materials have a relatively high work function and are transparent. When the organic light-emitting diode display device is a top-emission organic light-emitting diode display device, the first electrodes 121 may further include a reflective material such as silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca) or a combination thereof, in addition to the above-listed conductive materials. Accordingly, the first electrodes 121 may have a single-layer structure including the above-listed conductive material and the reflective material, or may have a multi-layer structure in which the single layers are stacked on one another.

An isolation layer 115 is disposed over the first electrode 121. The isolation 115 includes openings each exposing at least a part of the respective first electrodes 121. The isolation layer 115 may include an organic material or an inorganic material. In an exemplary embodiment, the isolation layer 115 may include a material such as a photoresist, a polyimide resin, an acrylic resin, a silicon compound and a polyacrylic resin.

The organic emissive layer 122 is disposed on the portions of the first electrodes 121 that are exposed by the isolation layer 115.

A second electrode 123 is disposed on the organic emissive layer 122. The second electrode 123 may be a common electrode extended across all the pixels. In addition, the second electrode 123 may be a cathode electrode of an organic light-emitting diode.

The second electrode 123 may be made of a material having a low work function. The second electrode 123 may include Li, Ca, LiF/Ca, LiF/Al, Al, Mg, Ag, Pt, Pd, Ni, Au, Nd, Ir, Cr, BaF, Ba, or a compound or mixture thereof, e.g., a mixture of Ag and Mg. The second electrode 123 may further include an auxiliary electrode. The auxiliary electrode may include a layer formed by depositing the material, and a transparent metal oxide on the layer such as indium-tin-oxide (ITO), indium-zinc-oxide (IZO), zinc oxide (ZnO) and indium-tin-zinc-oxide (ITZO).

When the organic light-emitting diode display device 10 is a top-emission organic light-emitting diode display device, a thin conductive layer having a small work function may be formed as the second electrode 123, and a transparent conductive layer such as indium-tin-oxide (ITO) layer, an indium-zinc-oxide (IZO) layer, a zinc oxide (ZnO) layer and an indium oxide ($In_2O_3$) layer may be formed thereon.

The above-described first electrode 121, the organic emissive layer 122 and the second electrode 123 may form an organic light-emitting diode.

A hole injection layer and/or a hole transport layer may be disposed between the first electrode 121 and the organic emissive layer 122, and an electron transport layer and/or an electron injection layer may be disposed between the organic emissive layer and the second electrode 123.

An encapsulation layer 116 is disposed on the second electrode 123. The encapsulation layer 116 includes an inorganic layer. The encapsulation layer 116 may include a plurality of layers stacked on one another. The encapsulation layer 116 may be made up of multiple layers including a first inorganic layer, an organic layer, and a second inorganic layer which are stacked in this order. The first inorganic layer and the second inorganic layer may include one or more selected from the group consisting of silicon oxide (SiOx), silicon nitride (SiNx) and silicon oxynitride (SiONx). The organic layer may include one selected from the group consisting of epoxy, acrylate and urethane acrylate.

The touch sensing unit 130 is disposed on the encapsulation layer 116. The encapsulation layer 116 may come in direct contact with the touch sensing unit 130. The touch sensing unit 130 will be described later in detail with reference to FIG. 4.

The black matrix 140 is disposed on the touch sensing unit 130. The black matrix 140 is disposed along the boundaries between the pixels and includes openings exposing the pixels. The black matrix 140 may have a grid shape connected to each other along the boundaries of the pixels. The organic emissive layers 122 below the black matrix 140 may overlap with the openings of the black matrix 140, respectively. As used herein, a phrase "a first element overlaps with a second element" means that the first element and the second element overlap with each other in the thickness direction of the organic light-emitting diode display device 10 (in the direction perpendicular to the first substrate in the drawings).

The black matrix 140 may include a light-absorbing material or a light-reflecting material. For example, the black matrix 140 may include a resin colored with black or a reflective metal such as chromium (Cr), etc.

A buffer layer or an organic layer may be further disposed between the black matrix 140 and the touch sensing unit 130. The buffer layer or the organic layer may be made up of a single layer or a stack of multiple layers.

Color filters 161_R, 161_G and 161_B may be disposed on the black matrix 140. The color filters may be disposed in the openings of the black matrix 140, respectively, and may extend over to the surface of the black matrix 140. Adjacent color filters may overlap with one another on the black matrix 140.

The red first color filter 161_R selectively transmits red light. The wavelength of the red light may range from approximately 620 nm to 750 nm. The green color filter selectively transmits green light. The wavelength of the green light may range from approximately 495 nm to 570 nm. The blue color filter selectively transmits blue light. The wavelength of the blue light may range from approximately 450 nm to 495 nm.

The first color filter 161_R may be disposed in the red pixel PX_R, the second color filter 161_G may be disposed in the green pixel PX_G, and the third color filter 161_B may be disposed in the blue pixel PX_B. The color filters 161_R, 161_G and 161_B of the same color are disposed on the respective organic emissive layers 122, thereby preventing color mixture in the pixels and increasing color gamut. Also, since the color filters 161_R, 161_G, and 161_B substantially absorb external light, the reflection of external light can be reduced even without use of a polarizing plate or the like.

The shapes of the first color filter 161_R, the second color filter 161_G and the third color filter 161_B may be substantially identical to as those of the pixels described above. That is to say, when the pixels have a diamond shape, each of the color filters may also have a diamond shape.

The color filters 161_R, 161_G, and 161_B may include an uneven outer surface formed by, e.g., color patterns of protrusions PT1, PT2, and PT3, respectively. As shown in the drawings, the color patterns of protrusions PT1, PT2 and PT3 may be formed on the upper surface of the color filters. Although the color patterns of protrusions PT1, PT2 and PT3 are shown in the drawings, color patterns of recesses in the locations of PT1, PT2 and PT3 may also be formed. This will be described later with reference to FIG. 9.

When the color patterns of protrusions PT1, PT2 and PT3 are formed, the height of the protrusions may range from 0.5 microns (μm) to 0.8 microns (μm) from the substantially flat top surface. When viewed from the top, the diameter of each of the protrusions of the color patterns PT1, PT2, PT3 may range from 2 microns (μm) to 6 microns (μm).

When the color filters 161_R, 161_G and 161_B include the color patterns of protrusions PT1, PT2 and PT3, the white angular dependency (WAD) of the organic light-emitting diode display device 10 can be reduced. A part of the light incident from the outside on the organic light-emitting diode display device 10 passes through the color filters 161_R, 161_G and 161_B and is reflected by the organic light-emitting diode display device 10. Then, the reflected light may exit through the color filters 161_R, 161_G and 161_B again. Another part of the light incident from the outside on the organic light-emitting diode display device 10 may not pass through the color filters 161_R, 161_G and 161_B but may be directly reflected to the outside. Such lights may result in the reducing of the WAD of the organic light-emitting diode display device 10.

By applying the color pattern PT1 to the color filters 161_R, 161_G and 161_B, the WAD resulted from the lights can be reduced.

Table 1 below is a table showing the measured values of efficiency, reflectance and WAD of Example 1 (this exemplary embodiment) and Comparative Examples 1 and 2. The values were measured from two cells. The reflectivity and efficiency shown in the table represent the values measured by the SCI (Specular Component Included) method and the SCE (Specular Component Excluded) method, and the efficiency ratio (ratio of the current efficiency). In the Table, the SCI is the results of measuring the straight light and diffused light after incident light is reflected, and the SCE is the results of measuring the diffused light after incident light is reflected.

The values of Example 1 were measured from the organic light-emitting diode display device 10 that employs the color filters 161_R, 161_G and 161_B including the color patterns of protrusions PT1, PT2 and PT3. The values of Comparative Example 1 were measured from an organic light-emitting diode display device that employs color filters without the color patterns of protrusions PT1, PT2 and PT3. The values of Comparative Example 2 were measured from an organic light-emitting diode display device that employs a polarizing plate instead of the color filters 161_R, 161_G and 161_B.

TABLE 1

|  | Example 1 | Comparative Example 1 | Comparative Example 2 |
| --- | --- | --- | --- |
| Efficiency | 120% | 133% | 100% |
| Reflectivity (SCI/SCE) | 5.43/0.93 | 5.57/0.63 | 5.34/0.45 |
| WAD | 0.007~0.013 | 0.018~0.022 | 0.006~0.010 |

It can be seen from Table 1 that the efficiency increases from Comparative Example 2, to Example 1 and Comparative Example 1. The efficiency in Table 1 is expressed as a relative value when the efficiency of the panel of Comparative Example 2 is taken as 100%. The efficiency was determined by measuring and comparing the current efficiency (Cd/mA).

Specifically, Comparative Example 2 exhibited the smallest reflection of external light, low WAD and the lowest efficiency, whereas Comparative Example 1 exhibited the highest efficiency and a very high reflection of external light and a very high WAD. In contrast, Example 1 exhibited reflection of external light and WAD comparable to those of Comparative Example 2 and the efficiency comparable to that of Comparative Example 1. Accordingly, Example 1 exhibited good reflection of external light, low WAD as well as high efficiency.

An adhesive layer 150 may be disposed over the color filters 161_R, 161_G, and 161_B, and the second substrate 102 may be disposed on the adhesive layer 150. The second substrate 102 may be implemented as a transparent substrate such as glass or plastic. The second substrate 102 may be a window substrate, a sealing substrate, or a protective substrate.

The adhesive layer 150 is interposed between the color filters and the second substrate 102 to couple them together. The adhesive layer 150 may include a film having adhesiveness, e.g., optically clear adhesive (OCA). As another example, the adhesive layer 150 may include an optically clear resin (OCR). The adhesive layer 150 and the second substrate 102 may be eliminated.

Next, the touch sensing unit 130 will be described.

Figure 4:
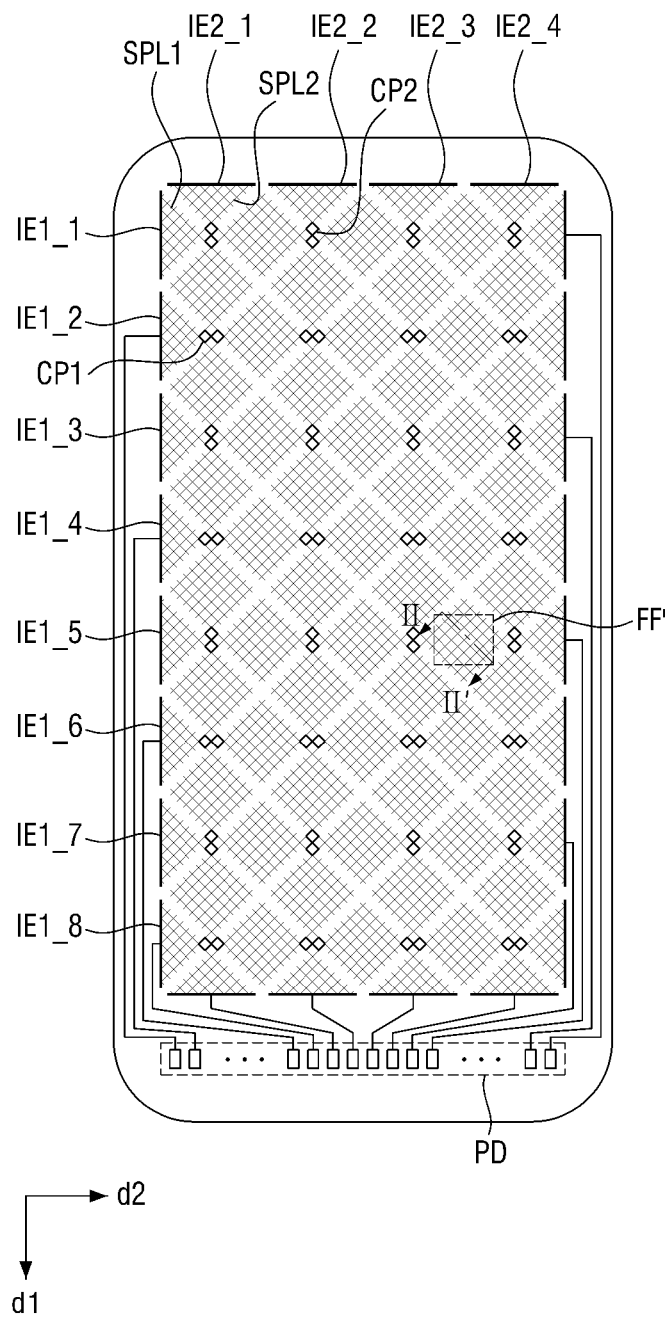
FIG. 4 is a plan view showing the layout of the touch sensing unit of FIG. 1.

FIG. 4 is a plan view showing the layout of the touch sensing unit of FIG. 1.

The touch sensing unit 130 will be described with FIG. 3. As described above, the touch sensing unit 130 is disposed between the encapsulation layer 116 and the black matrix 140.

Portion FF' shown in FIG. 4 may refer to the portion FF of the organic light-emitting diode display device 10 shown in FIG. 1.

Referring to FIG. 4, the touch sensing unit 130 may include a plurality of first sensing electrodes IE1-1 to IE1-8, and a plurality of second sensing electrodes IE2-1 to IE2-4. The plurality of first sensing electrodes IE1-1 to IE1-8 may be extended along a first direction d1. The plurality of second sensing electrodes IE2-1 to IE2-4 may be extended along a second direction d2. In an exemplary embodiment, the first direction d1 may intersect with the second direction d2. In FIG. 4, the first direction d1 refers to the column direction, while the second direction d2 refers to the row direction.

This will be described in more detail. Each of the plurality of first sensing electrodes IE1-1 to IE1-8 may include a plurality of first sensing lines SPL1 having a mesh shape. The areas defined by the plurality of first sensing lines SPL1 may overlap with the organic emissive layers 122_1, 122_2, and 122_3 (see FIG. 2). The touch sensing unit 130 may further include a plurality of first connection portions CP1 electrically connecting between adjacent ones of the plurality of first sensing electrodes IE1-1 to IE1-8.

Each of the plurality of second sensing electrodes IE2-1 to IE2-4 may include a plurality of second sensing lines SPL2 having a mesh shape. The areas defined by the plurality of second sensing lines SPL2 may also overlap with the organic emissive layers. The touch sensing unit 130 may further include a plurality of second connection portions CP2 electrically connecting between adjacent ones of the plurality of second sensing electrodes IE2-1 to IE2-4.

The areas defined by the plurality of first sensing lines SPL1 and the areas defined by the plurality of second sensing lines SPL2 may have a diamond shape, for example. As used herein, the term a diamond shape encompasses not only a diamond shape but also a simple geometric shape approximating a diamond shape under different processing conditions.

The first sensing lines SPL1 are electrically insulated from the second sensing lines SPL2. In an exemplary embodiment, the plurality of first sensing lines SPL1 may be disposed on the same layer as the plurality of second sensing lines SPL2. Then, the plurality of first connection portions CP1 and the plurality of second connection portions CP2 are disposed in different layers, thereby being electrically insulated. In another exemplary embodiment, the plurality of first sensing lines SPL1 may be disposed on different layers from the plurality of second sensing lines SPL2.

The plurality of first sensing lines SPL1 and the plurality of second sensing lines SPL2 may include a conductive material. In an exemplary embodiment, the conductive material may include a low-resistance metal such as silver (Ag), aluminum (Al), chromium (Cr) and nickel (Ni), or a conductive nano material such as a silver nanowire and a carbon nanotube.

The touch sensing unit 130 may further include a signal pad unit PD for providing signals to the plurality of first sensing electrodes IE1-1 to IE1-8 and the plurality of second sensing electrodes IE2-1 to IE2-4, and a plurality of signal lines.

Referring back to FIG. 3, the first sensing lines SPL1 may be disposed directly on the encapsulation layer 116. It is, however, to be understood that the invention is not limited thereto. For example, in another exemplary embodiment, an insulating layer of a single film or multiple films may be disposed between the encapsulation layer 116 and the first sensing lines SPL1.

The first insulating layer 131 may be disposed over the first sensing lines and the encapsulation layer 116.

In an exemplary embodiment, the first insulating layer 131 may include an inorganic material. The inorganic material may include at least one selected from the group consisting of silicon oxide (SiOx), silicon nitride (SiNx), and silicon oxynitride (SiONx). In another exemplary embodiment, the first insulating layer 131 may include an organic material. The organic material may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The plurality of second sensing lines SPL2 may be disposed on the first insulating layer 131. The first sensing lines SPL1 and the second sensing lines SPL2 may overlap the black matrix 140 and the isolation layer 115. That is to say, as the first sensing lines SPL1 and the second sensing lines SPL2 are completely overlapped with the black matrix 140, it is possible to hide them from viewers.

The second insulating layer 132 may be disposed over the first insulating layer 131 and the second sensing lines SPL2. In an exemplary embodiment, the second insulating layer 132 may include an inorganic material or an organic material. The types of the inorganic material and the organic material are the same as those of the first insulating layer 131; and, therefore, the redundant description will be omitted. Although the first insulating layer 131 and the second insulating layer 132 are depicted as single layers in FIG. 3, this is merely illustrative. They may have a multilayer structure.

Although not shown in FIG. 3, the plurality of first connection portions CP1 electrically connecting the first sensing lines SPL1 with one another may be disposed on the first insulation layer 131, and the plurality of second connection portions CP2 electrically connecting the second sensing lines SPL2 with one another may be disposed on the second insulating layer 132.

The second insulating layer 132 may be a passivation layer or a planarization layer.

Hereinafter, a method of forming the color patterns of protrusions PT1, PT2 and PT3 on the color filters 161_R, 161_G, and 161_B, respectively, will be described.

Figure 5:
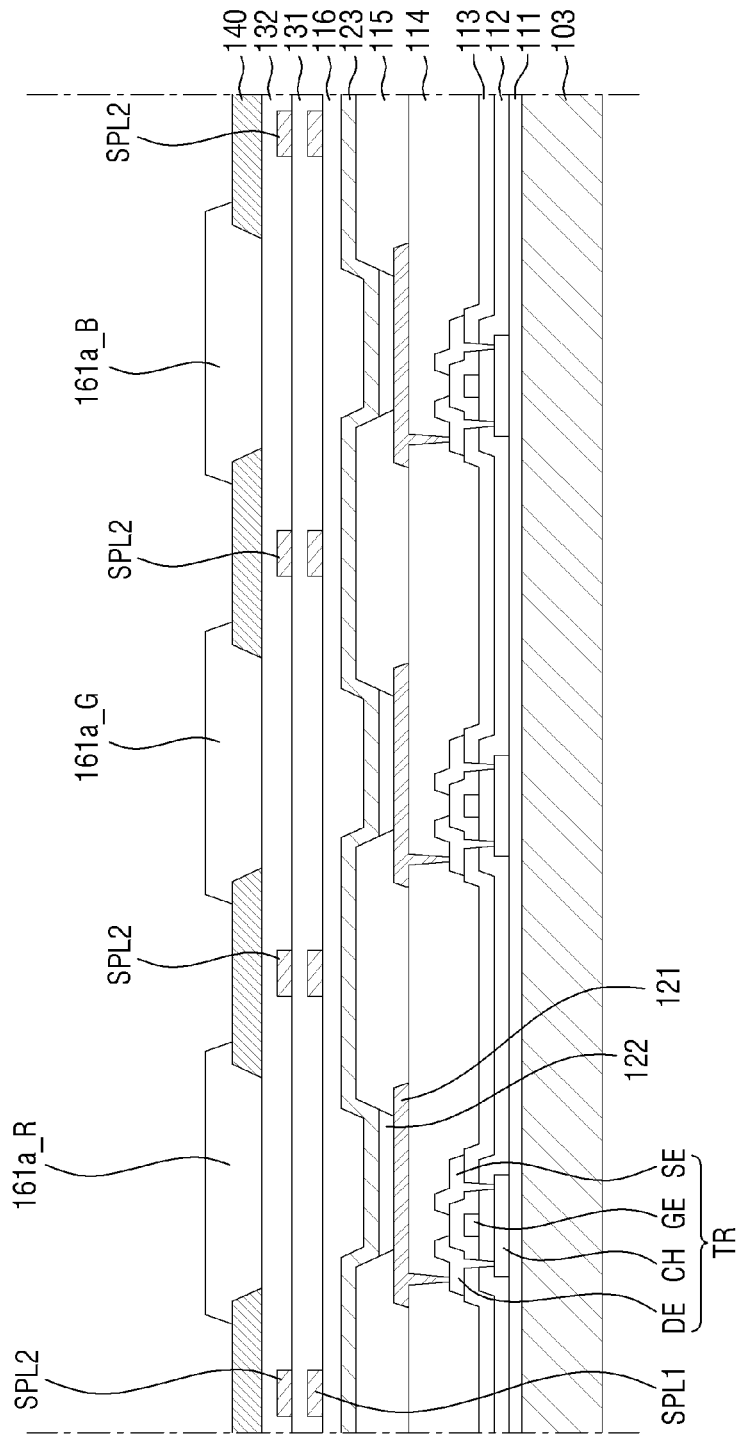
FIGS. 5, 6, and 7 are cross-sectional views showing processing steps of forming color patterns of protrusions during manufacture of an organic light-emitting diode display device constructed according to an exemplary embodiment of the invention.
Figure 6:
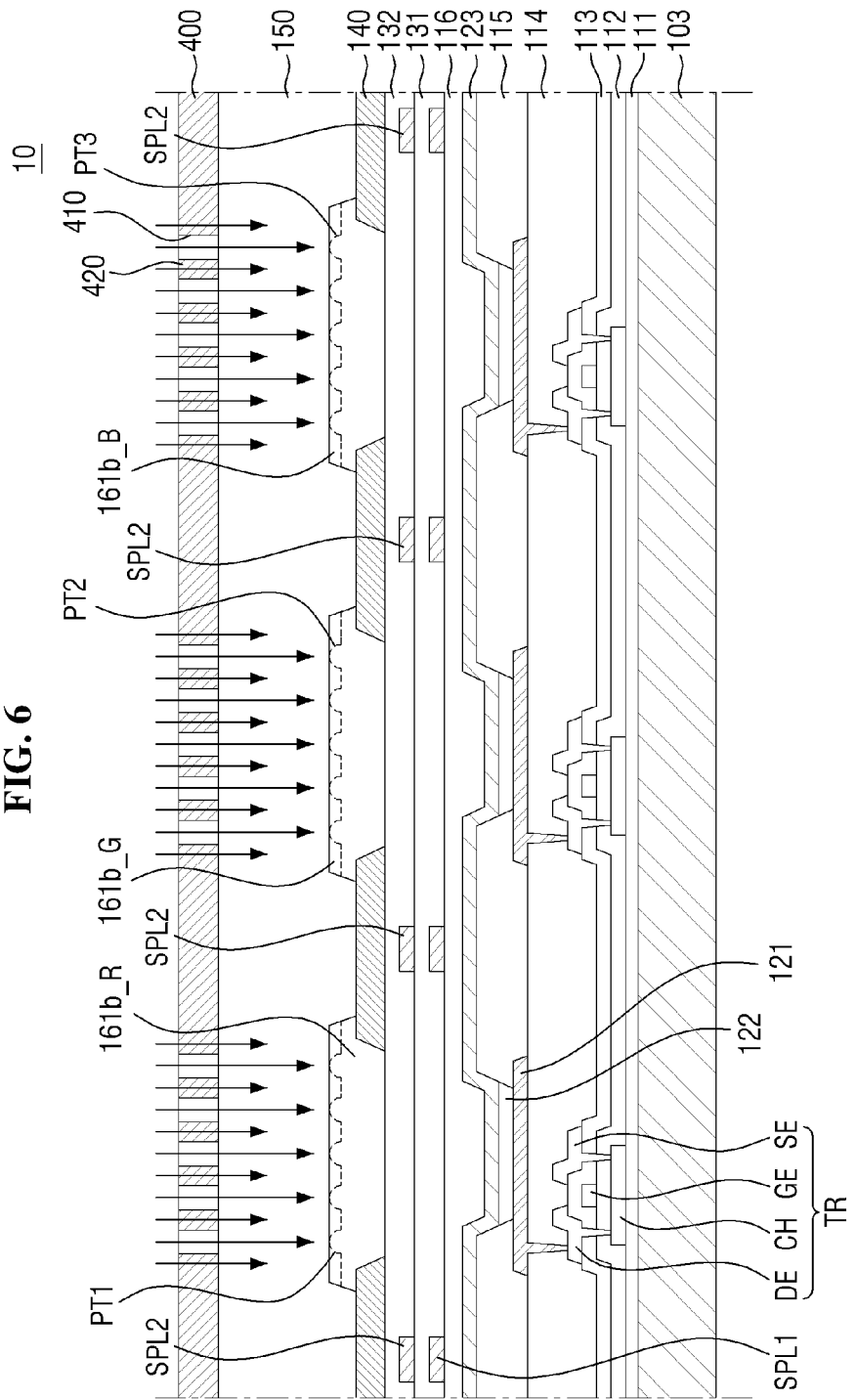
Figure 7:
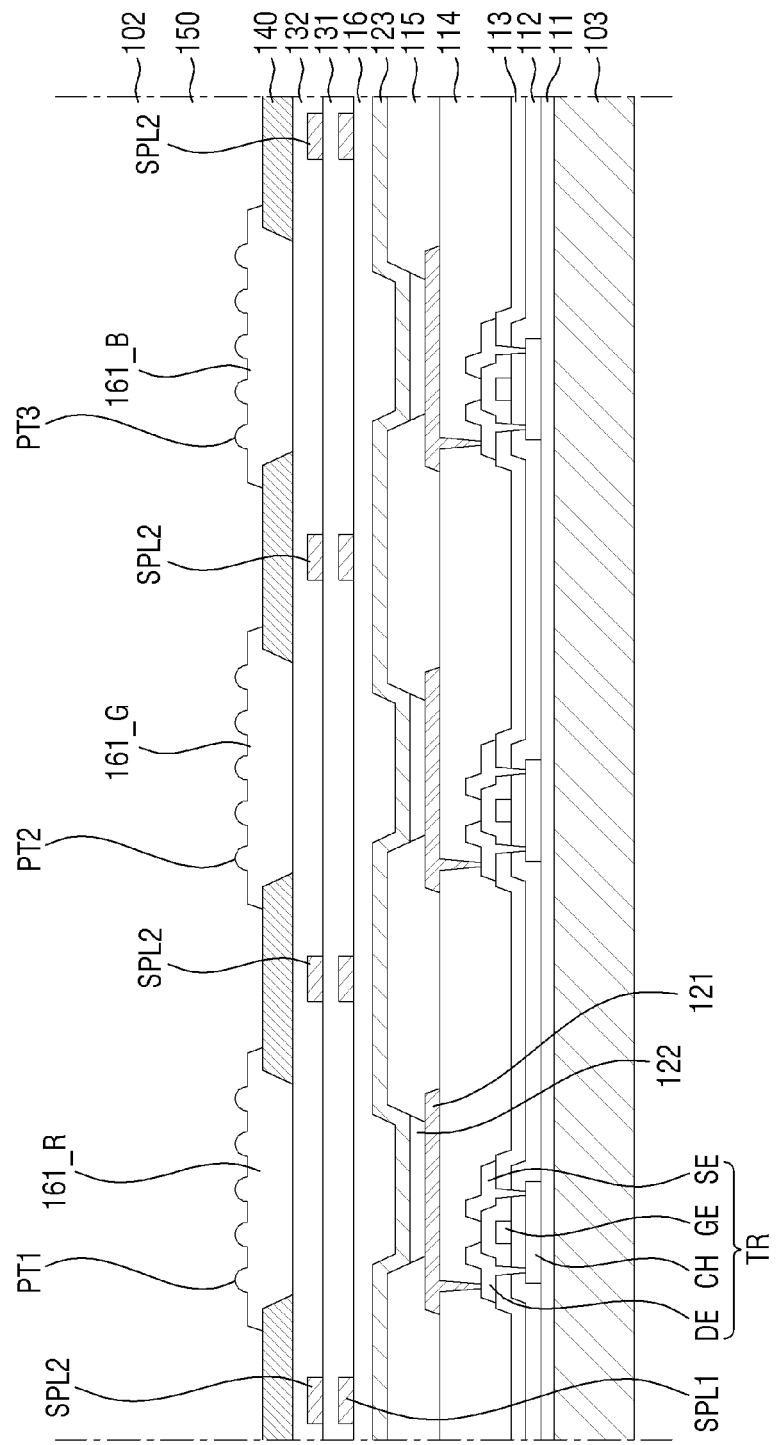

FIGS. 5, 6, and 7 are cross-sectional views showing processing steps of forming color patterns of protrusions during manufacture of an organic light-emitting diode display device constructed according to an exemplary embodiment of the invention.

Initially, as shown in FIG. 5, organic material layers 161a_R, 161a_G and 161a_B are formed in the openings of the black matrix 140, respectively. The organic material layers 161a_R, 161a_G and 161a_B may be applied by slit coating, spin coating, gravure printing, etc. The organic material layers 161a_R, 161a_G and 161a_B may include a photosensitive material. The photosensitive material may be a positive-type photosensitive material or a negative-type photosensitive material. Although the organic material layers 161a_R, 161a_G and 161a_B include a negative-type photosensitive material in this exemplary embodiment, the invention is not limited thereto.

Subsequently, as shown in FIG. 6, a half-tone mask 400 is disposed above the organic material layers 161a_R, 161a_G, and 161a_B. The half-tone mask 400 includes transparent portions 410 and translucent portions 420. The transparent portions 410 are aligned with portions where the protrusions PT1, PT2 and PT3 are to be formed, and the translucent portions 420 are aligned with portions other than the portions where the protrusions PT1, PT2 and PT3 are to be formed. Subsequently, the organic material layers 161b_R, 161b_G and 161b_B are subjected to an exposure process and then are subjected to a developing process. As a result, the color filters 161_R, 161_G, and 161_B including the color patterns of protrusions PT1, PT2, and PT3 may be produced, as shown in FIG. 7.

Hereinafter, other exemplary embodiments of the invention will be described.

Figure 8:
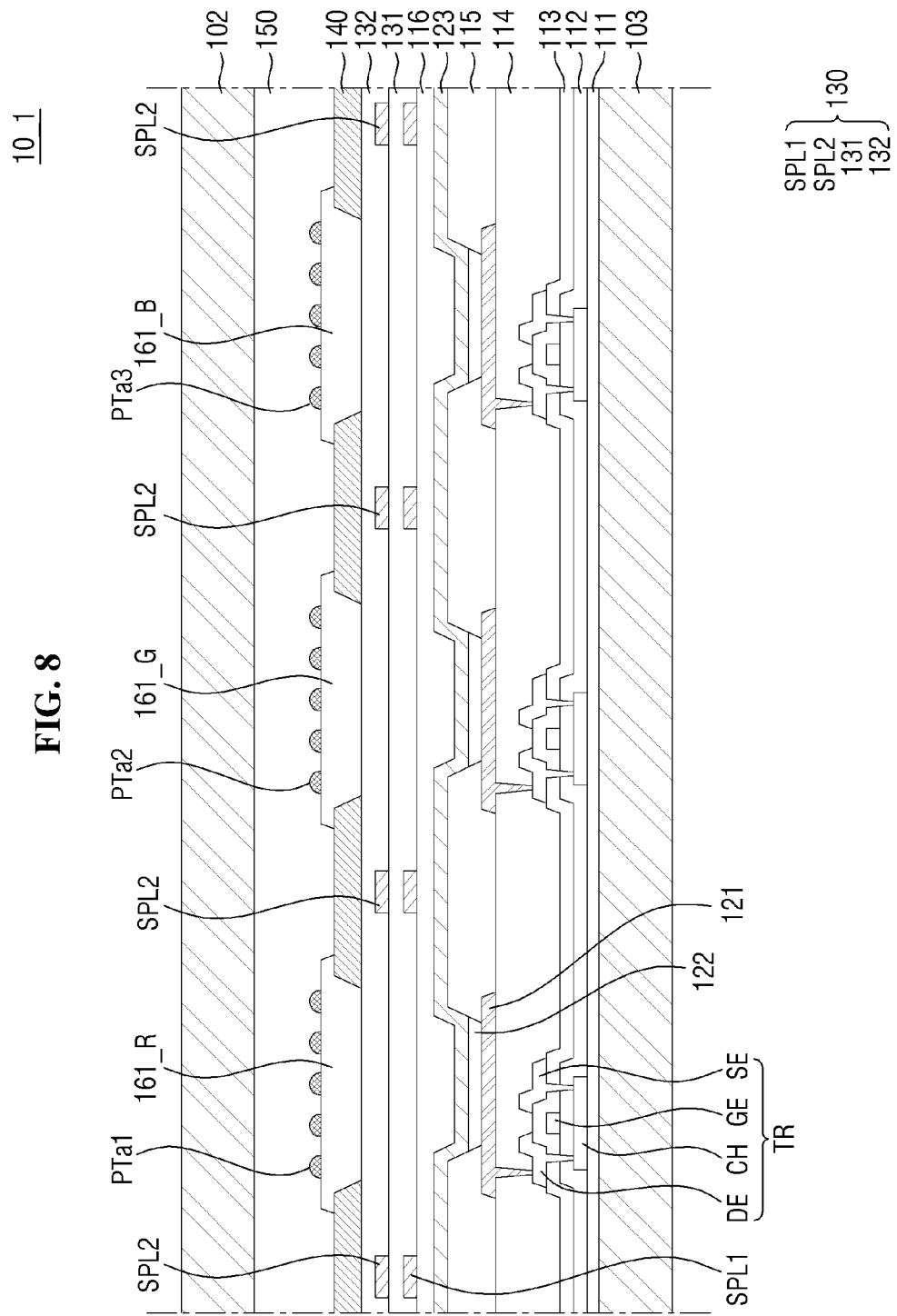
FIG. 8 is a cross-sectional view of an organic light-emitting diode display device constructed according to another exemplary embodiment of the invention.

FIG. 8 is a cross-sectional view of an organic light-emitting diode display device constructed according to another exemplary embodiment of the invention.

An organic light-emitting diode display device 10_1 according to the exemplary embodiment shown in FIG. 8 is substantially identical to the organic light-emitting diode display device shown in FIG. 3 except that additional protrusion patterns PTa1, PTa2 and PTa3 are disposed on the color filters 161_R, 161_G, and 161_B having substantially flat top surfaces.

The protrusion patterns PTa1, PTa2 and PTa3 may include the same organic material as the color filters 161_R, 161_G, and 161_B. In the organic light-emitting diode display device 10_1 including the additional protrusion patterns PTa1, PTa2 and PTa3 disposed on the color filters 161_R, 161_G and 161_B, reduces the WAD, as in the exemplary embodiment shown in FIG. 3.

Figure 9:
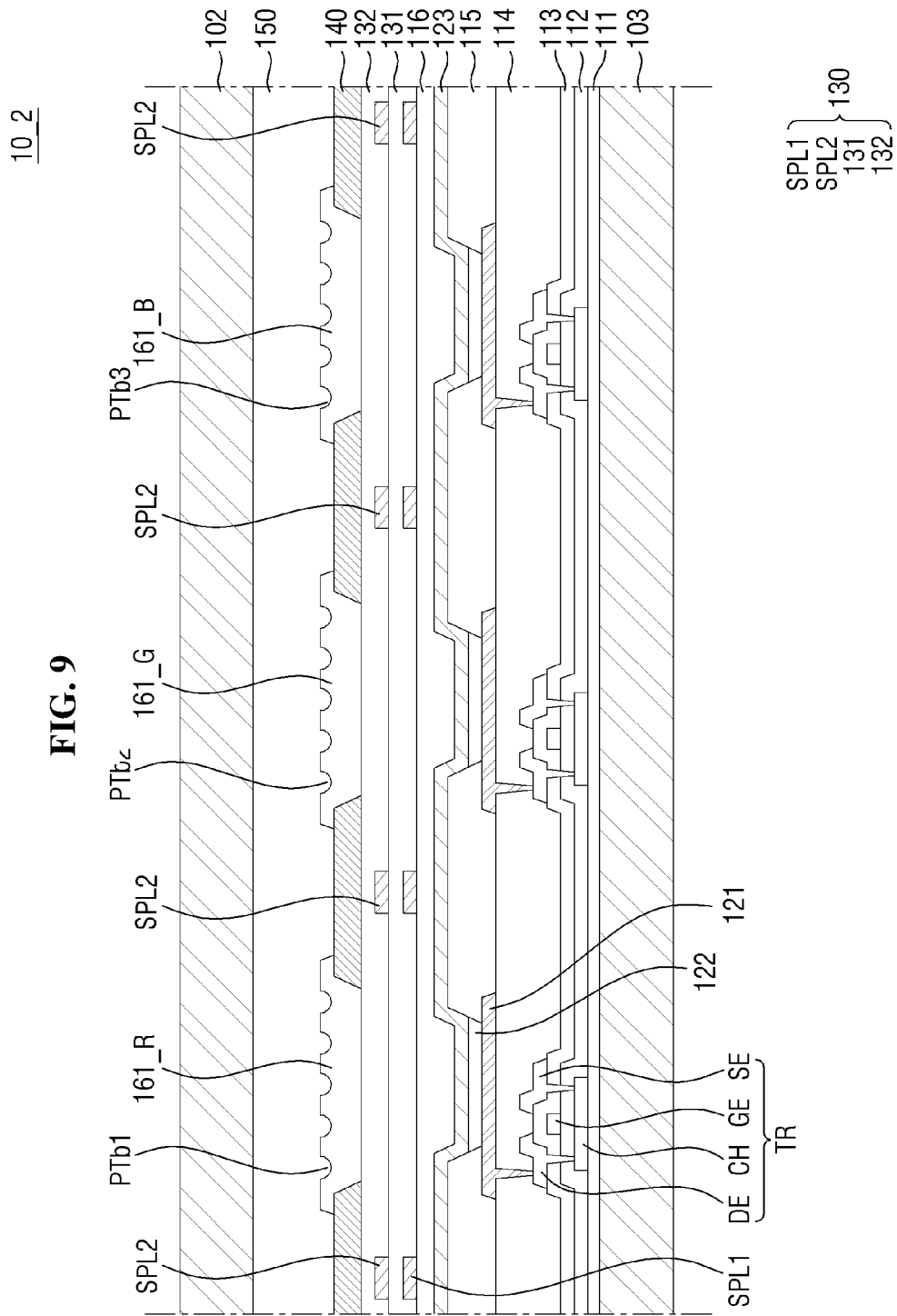
FIG. 9 is a cross-sectional view of an organic light-emitting diode display device constructed according to yet another exemplary embodiment of the invention.

FIG. 9 is a cross-sectional view of an organic light-emitting diode display device constructed according to yet another exemplary embodiment of the invention.

An organic light-emitting diode display device 10_2 according to the exemplary embodiment shown in FIG. 9 is substantially identical to the organic light-emitting diode display device shown in FIG. 3 except that the color filters 161_R, 161_G and 161_B include color patterns of recesses PTb1, PTb2, and PTb3.

In the organic light-emitting diode display device 10_2 including the color filters 161_R, 161_G and 161_B employing the color patterns of recesses PTb1, PTb2 and PTb3, reduces the WAD, as in the exemplary embodiment shown in FIG. 3.

FIG. 10 is a cross-sectional view of an organic light-emitting diode display device constructed according to yet another exemplary embodiment of the invention.

An organic light-emitting diode display device 11 according to the exemplary embodiment shown in FIG. 10 is substantially identical to the organic light-emitting diode display device shown in FIG. 3 except that a protective layer 214 has an uneven upper surface.

It is to be noted that the protective layer 214 of FIG. 10 is substantially identical to the protective layer 114 of FIG. 3, although indicated with the different reference numeral.

The protective layer 214 may include portions overlapping with the black matrix 140 and portions not overlapping with the black matrix 140. The upper surface of the protective layer 214 may be substantially flat in the portions overlapping with the black matrix 140. The upper surface of the protective layer 214 may be uneven in the portions not overlapping with the black matrix 140. The uneven surface may include concave portions 214_CC, convex portions 214_CV protruding upward from the concave portions, and inclined portions connecting the concave portions 214_CC with the convex portions 214_CV.

Although the protective layer 214 has a v-shaped concavo-convex surface on its upper surface, the protective layer 214 may have the same shape as the color patterns PT1, PT2, and PT3.

An organic light-emitting element may be disposed on the protective layer 214. The first electrodes 121 may be disposed on the protective layer. The organic emissive layers 122 may be disposed on the first electrodes. The second electrode 123 may be disposed on the organic light-emitting element.

The first electrodes 121 and the organic emissive layer 122 disposed on the upper surface of the protective layer 214 may have a shape conforming to the uneven upper surface of the protective layer 214. Specifically, the first electrodes 121 and the organic emissive layers 122 may include concave portions, convex portions protruding upward from the concave portions, and inclined portions connecting the concave portions with the convex portions.

The second electrode 123 may include portions overlapping with the black matrix 140 and portions not overlapping with the black matrix 140, like the protective layer 214. The second electrode 123 may conform to the protective layer 214 such that it may be substantially flat in the portions overlapping with the black matrix 140 and may be uneven in the portion not overlapping with the black matrix 140. Specifically, the second electrode 123 may include concave portions, convex portions protruding upward from the concave portions, and inclined portions connecting the concave portions with the convex portions.

According to this exemplary embodiment, the WAD of the organic light-emitting diode display device 11 can be reduced not only due to the color filters including the color patterns of protrusions PT1, PT2 and PT3 but also due to the first electrodes 121, the organic emissive layers 122 and the second electrode 123 having the uneven surfaces.

Figure 11:
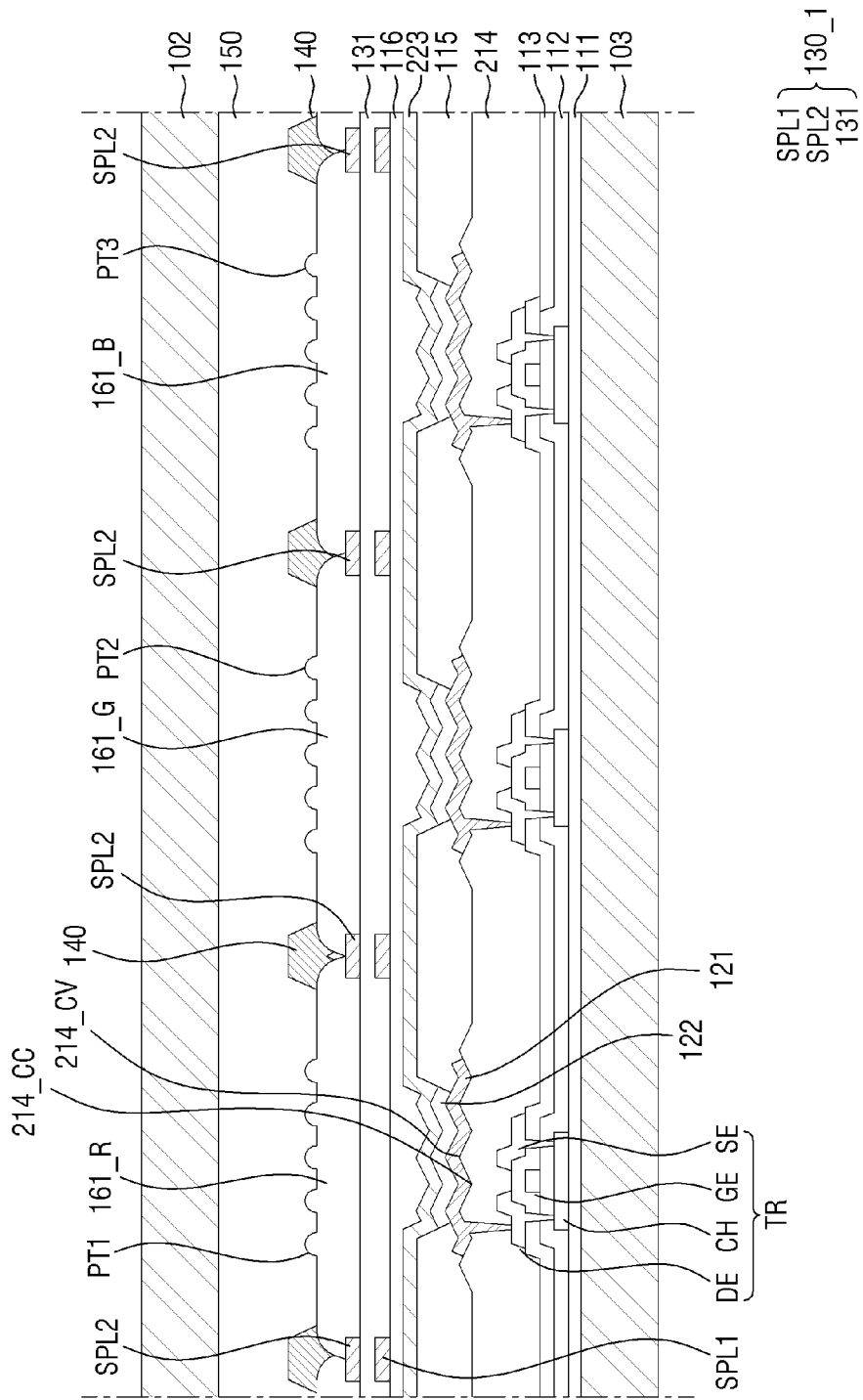
FIG. 11 is a cross-sectional view of an organic light-emitting diode display device constructed according to yet another exemplary embodiment of the invention.

FIG. 11 is a cross-sectional view of an organic light-emitting diode display device constructed according to yet another exemplary embodiment of the invention.

Referring to FIG. 11, an organic light-emitting diode display device 12 according to this exemplary embodiment of the invention is substantially identical to the organic light-emitting diode display device shown in FIG. 10 except that color filters 161_R, 161_G and 161_B are disposed directly on second sensing lines SPL2 and that a black matrix 140 is disposed on the color filters 161_R, 161_G and 161_B.

In the organic light-emitting diode display device 12 according to this exemplary embodiment of the invention, a touch sensing unit 130_1 may be disposed directly on an encapsulation layer 116, like the exemplary embodiment shown in FIG. 10.

The touch sensing unit 130_1 may include first sensing lines SPL1 disposed on the encapsulation layer 116, a first insulating layer 131 disposed over the first sensing lines SPL1, and second sensing lines SPL2 disposed on the first insulating layer 131.

A plurality of color filters 161_R, 161_G and 161_B may be disposed on the touch sensing unit 130_1. That is to say, the plurality of color filters 161_R, 161_G and 161_B may come in contact the second sensing lines SPL2. The boundary between the first color filter 161_R and the second color filter 161_G may overlap with the second sensing line SPL2.

The plurality of color filters 161_R, 161_G and 161_B may include color patterns of protrusions PT1, PT2 and PT3 on their upper surfaces, respectively, which are not described again to avoid redundancy.

The black matrix 140 including openings may be disposed on the color filters 161_R, 161_G, and 161_B. The black matrix 140 may be disposed along the boundary between the first color filter 161_R and the second color filter 161_G. In addition, the black matrix 140 may be disposed to overlap the second sensing lines SPL2. The black matrix 140 may be disposed on the plurality of color filters 161_R, 161_G and 161_B so that the color patterns of protrusions PT1, PT2 and PT3 of the color filters 161_R, 161_G and 161_B are exposed via the openings of the black matrix 140.

Figure 12:
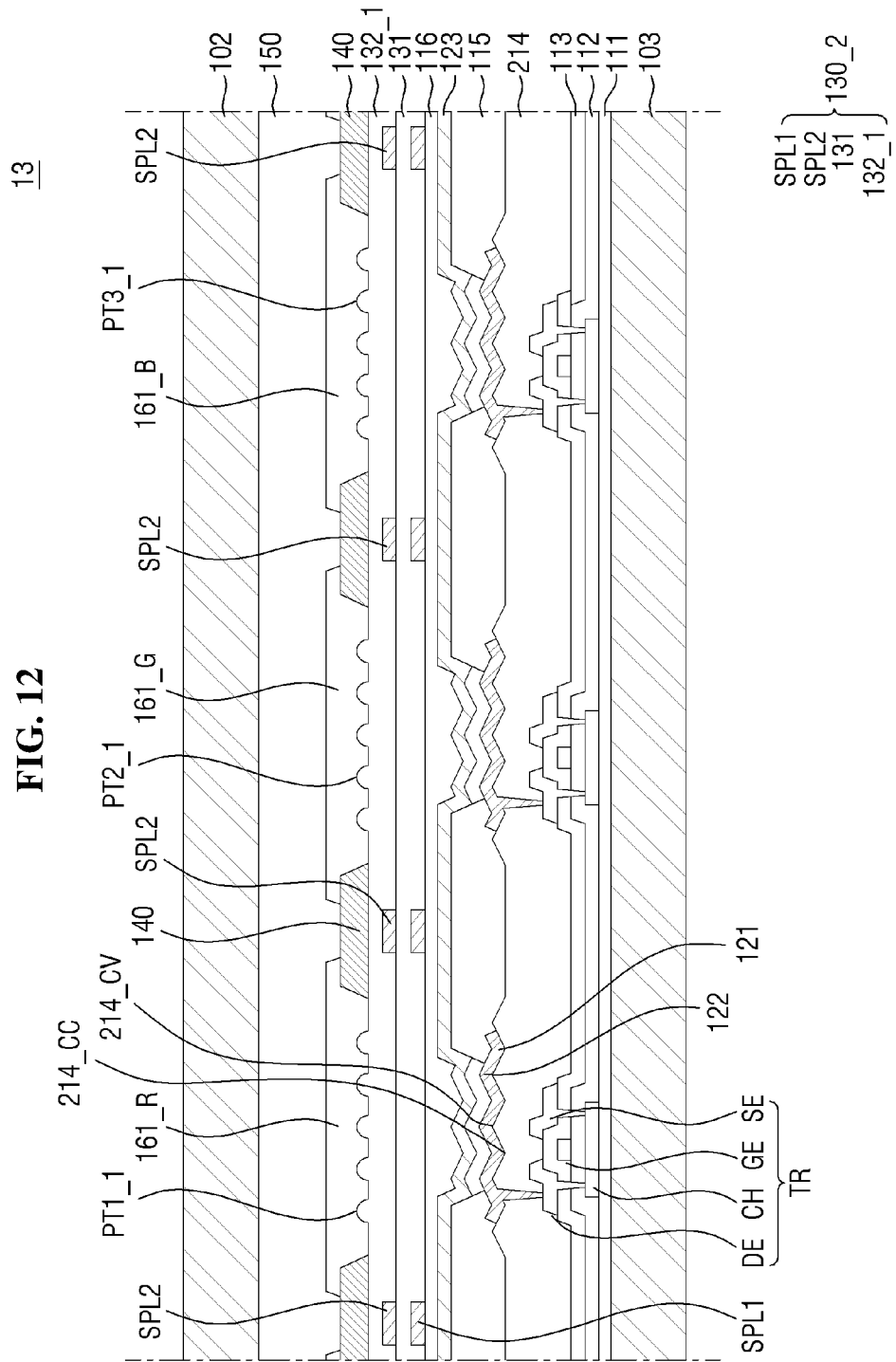
FIG. 12 is a cross-sectional view of an organic light-emitting diode display device constructed according to yet another exemplary embodiment of the invention.

FIG. 12 is a cross-sectional view of an organic light-emitting diode display device constructed according to yet another exemplary embodiment of the invention.

Referring to FIG. 12, an organic light-emitting diode display device 13 according to this exemplary embodiment of the invention is different from the organic light-emitting diode display device according to the exemplary embodiment of FIG. 10 in that the color filters 161_R, 161_G, and 161_B have uneven lower surfaces.

A touch sensing unit 130_2 may include a second insulating layer 132_1 having protrusion patterns PT1_1, PT2_1 and PT3_1 on its upper surface. The second insulating layer 132_1 may include portions including the protrusion patterns PT1_1, PT2_1 and PT3_1 on the upper surface, and portions not including the protrusion patterns PT1_1, PT2_1 and PT3_1 on the upper surface. A black matrix 140 including openings may be disposed on the second insulating layer 132_1 along the portion including the uneven patterns PT1_1, PT2_1 PT3_1. The openings of the black matrix 140 may expose the portion including the uneven patterns PT1_1, PT2_1 PT3_1 of the second insulating layer 132_1.

Color filters 161_R, 161_G and 161_B may be disposed in the openings of the black matrix 140. The lower surfaces of the color filters 161_R, 161_G and 161_B may come in contact with the protrusion patterns PT1_1, PT2_1 and PT3_1 of the second insulating layer 132_1. The lower surfaces of the color filters 161_R, 161_G and 161_B may come in contact with and conform to the protrusion patterns PT1_1, PT2_1 and PT3_1 of the second insulating layer 132_1.

Figure 13:
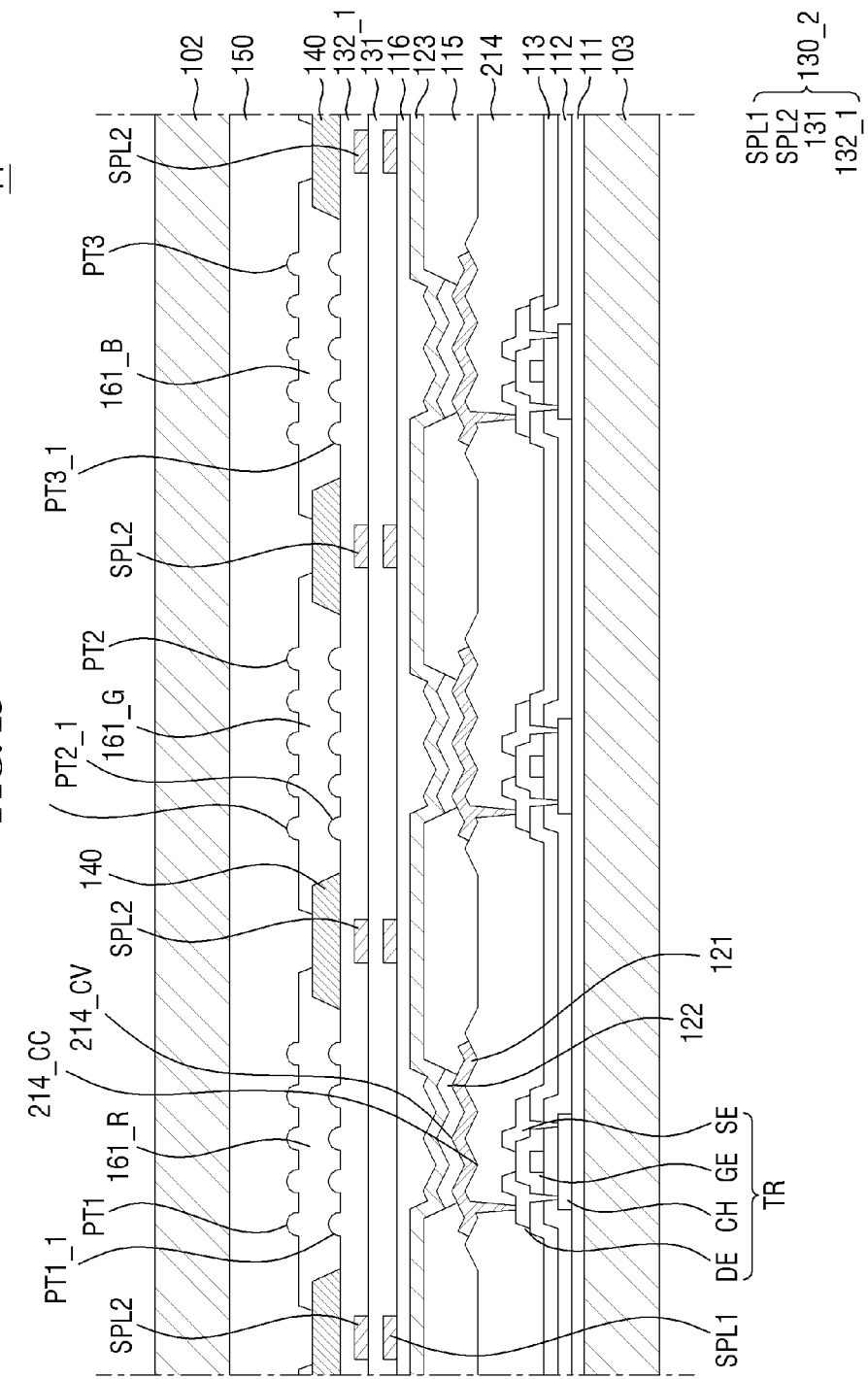
FIG. 13 is a cross-sectional view of an organic light-emitting diode display device constructed according to yet another exemplary embodiment of the invention.

FIG. 13 is a cross-sectional view of an organic light-emitting diode display device constructed according to yet another exemplary embodiment of the invention.

An organic light-emitting diode display device 14 according to the exemplary embodiment shown in FIG. 13 is substantially identical to the organic light-emitting diode display device shown in FIG. 12 except that color filters 161_R, 162_G and 163_B further include color patterns of protrusions PT1, PT2, and PT3 on the upper surfaces.

The organic light-emitting diode display device 14 according to this exemplary embodiment of the invention may include color filters 161_R, 162_G and 163_B having uneven lower surfaces and color patterns of protrusions PT1, PT2 and PT3 on the upper surface.

A touch sensing unit 130_2 may include a second insulating layer 132_1 having protrusion patterns PT1_1, PT2_1 and PT3_1 on its upper surface. The second insulating layer 132_1 may include portions including the protrusion patterns PT1_1, PT2_1 and PT3_1 on the upper surface, and portions not including the protrusion patterns PT1_1, PT2_1 and PT3_1 on the upper surface. A black matrix 140 including openings may be disposed on the second insulating layer 132_1 along the portion including the uneven patterns PT1_1, PT2_1, PT3_1. The openings of the black matrix 140 may expose the portion including the uneven patterns PT1_1, PT2_1, PT3_1 of the second insulating layer 132_1.

Color filters 161_R, 161_G and 161_B may be disposed in the openings of the black matrix 140. The lower surfaces of the color filters 161_R, 161_G and 161_B may come in contact with the protrusion patterns PT1_1, PT2_1 and PT3_1 of the second insulating layer 132_1. The lower surfaces of the color filters 161_R, 161_G and 161_B may come in contact with and conform to the protrusion patterns PT1_1, PT2_1 and PT3_1 of the second insulating layer 132_1.

The color filters 161_R, 161_G, and 161_B may include color patterns of protrusions PT1, PT2, and PT3, respectively. The color patterns of protrusions PT1, PT2 and PT3 may be formed by the method described above with reference to FIGS. 5 to 7.

Figure 14:
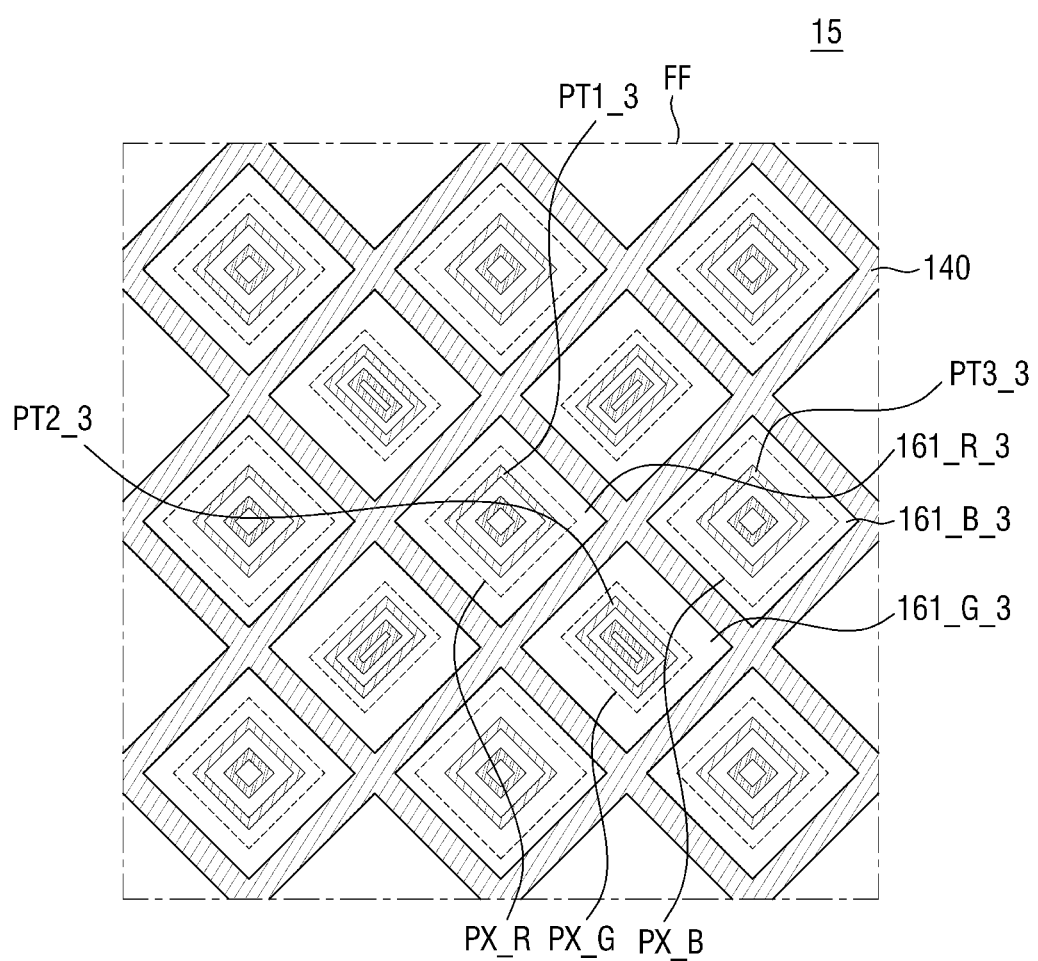
FIGS. 14 and 15 are views showing the layouts of organic light-emitting diode display devices constructed according to other exemplary embodiments of the invention.
Figure 15:
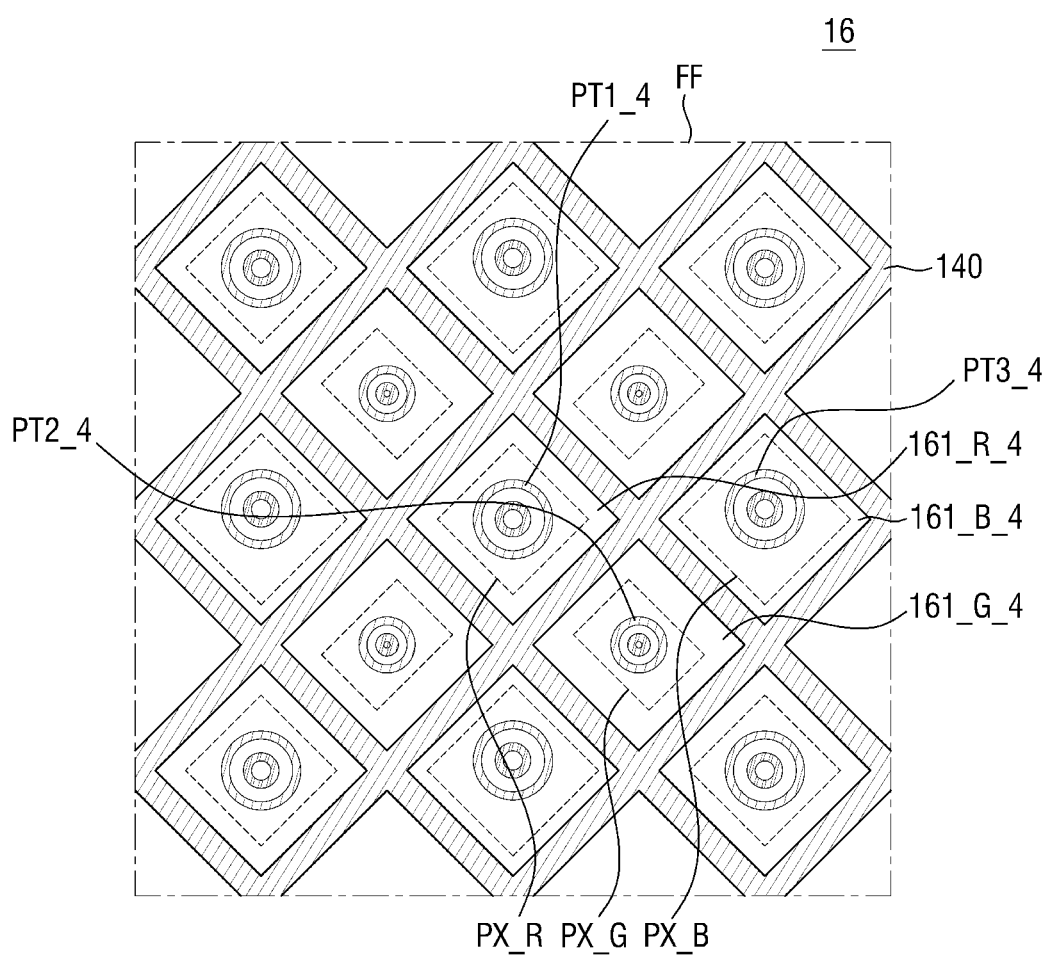

FIGS. 14 and 15 are views showing the layouts of organic light-emitting diode display devices constructed according to other exemplary embodiments of the invention.

An organic light-emitting diode device 15 according to the exemplary embodiment shown in FIG. 14 and the organic light-emitting diode display device 16 according to the exemplary embodiment shown in FIG. 15 are different from the organic light-emitting diode display device according to the exemplary embodiment shown in FIG. 2 in that the former includes color filters 161_R_3, 161_G_3, 161_B_3, 161_R_4, 161_G_4, and 161_B_4 having different shapes of color patterns PT1_3, PT2_3, PT3_3, PT1_4, PT2_4 and PT3_4 when viewed from the top.

Referring to FIGS. 14 and 15, protrusions included in the upper surfaces of the color filters 161_R_3, 161_G_3, 161_B_3, 161_R_4, 161_G_4 and 161_B_4 may have a plurality of closed shapes, other than the shape including a plurality of dots as shown in FIG. 2. For example, the protrusions may have a closed shape including a plurality of polygons as shown in FIG. 14, and a closed shape including a plurality of circles as shown in FIG. 15. Although FIG. 14 shows that the polygon is a quadrangle, this is merely illustrative. In another exemplary embodiment, the color patterns PT1_3, PT2_3, PT3_3, PT1_4, PT2_4 and PT3_4 may include various regular polygonal or irregular shapes.

The color patterns PT1_3, PT2_3, PT3_3, PT1_4, PT2_4 and PT3_4 of various shapes included in the upper surfaces of the color filters can reduce the WAD.

The lower surface of the color filters 161_R_3, 161_G_3, 161_B_3, 161_R_4, 161_G_4 and 161_B_4 may include an uneven pattern, and the uneven pattern may include various shapes.

Figure 16:
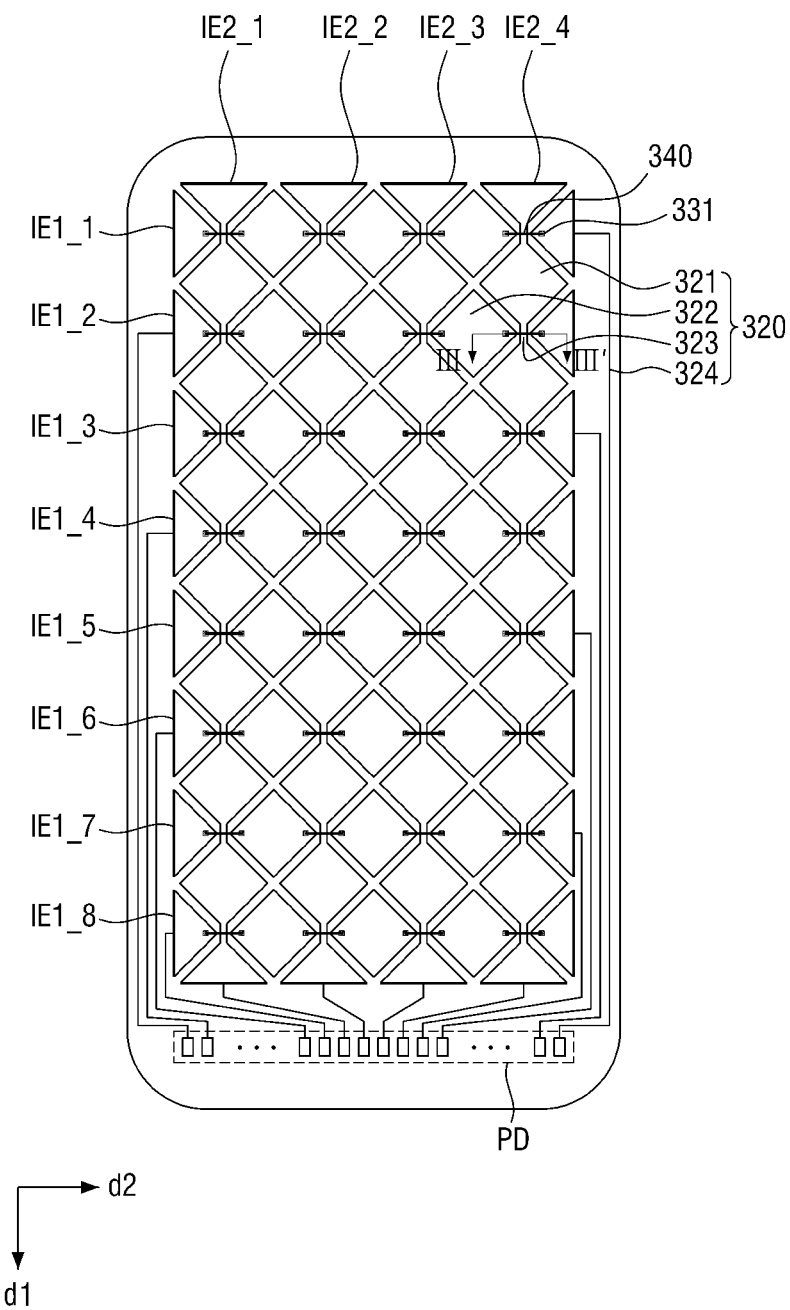
FIG. 16 is a plan view of a touch sensing unit of an organic light-emitting diode display device constructed according to yet another exemplary embodiment of the invention.
Figure 17:
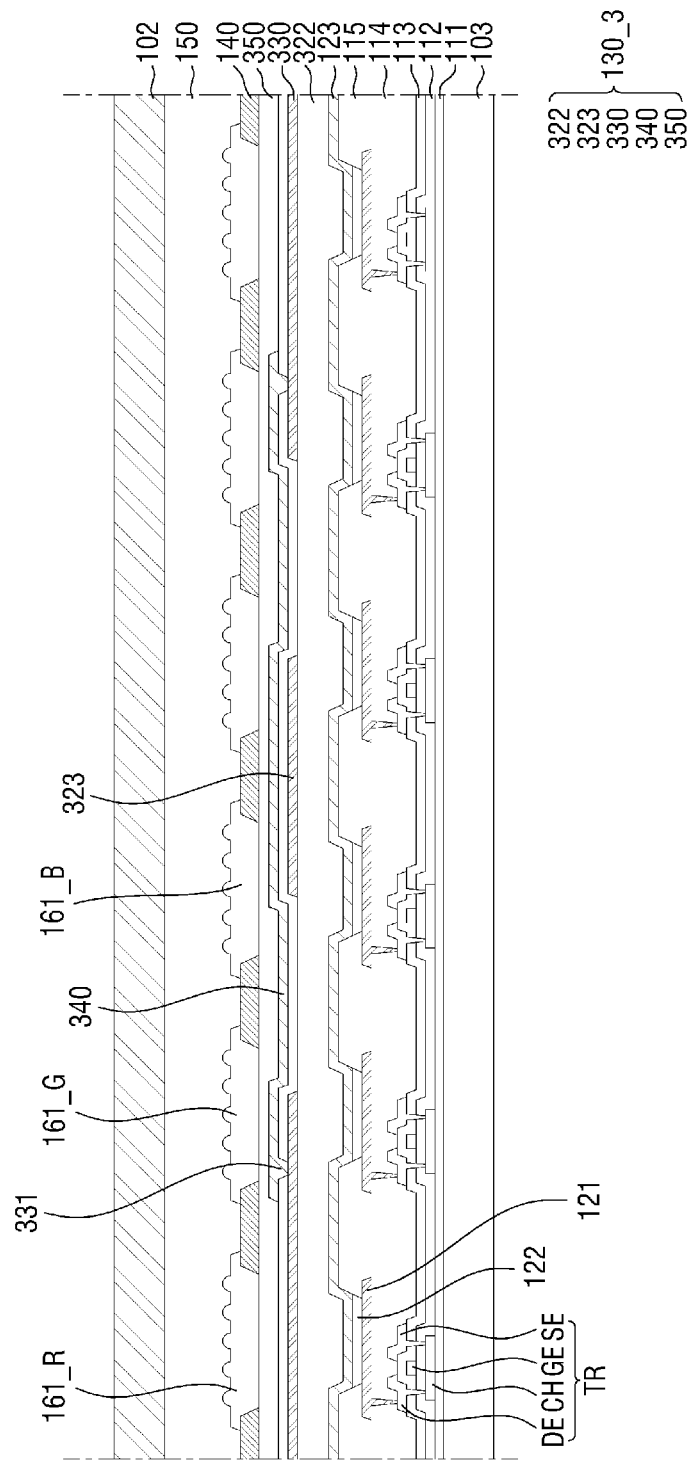
FIG. 17 is a cross-sectional view of the organic light-emitting diode display device of FIG. 16.

FIG. 16 is a plan view of a touch sensing unit of an organic light-emitting diode display device constructed according to another exemplary embodiment of the invention. FIG. 17 is a cross-sectional view of the organic light-emitting diode display device of FIG. 16.

The exemplary embodiments of FIGS. 16 and 17 differ from the exemplary embodiments of FIGS. 3 and 4 in that the former includes another type of touch sensing unit 130_3.

Referring to FIGS. 16 to 17, a first wiring layer 320 is disposed directly on an encapsulation layer 116. The first wiring layer 320 includes a plurality of first sensing electrodes and a plurality of second sensing electrodes. The first sensing electrodes and the second sensing electrodes may acquire position information of a touched point by a self capacitance method and/or a mutual capacitance method.

In other exemplary embodiments of the invention, a base or an insulating layer may be further disposed between the encapsulation layer 116 and the first wiring layer, which is be made of, e.g., glass or plastic such as polyethylene terephthalate (PET), polyimide (PI), polycarbonate (PC), polyethylene (PE), polypropylene (PP), polysulfone (PSF), polymethylmethacrylate (PMMA), triacetylcellulose (TAC), and cycloolefin polymer (COP).

The first sensing electrodes 321 and the second sensing electrodes 322 may be arranged in a matrix. Each of the first sensing electrodes 321 and the second sensing electrodes 322 may have, but is not limited to, a diamond shape. The first sensing electrodes 321 may be electrically connected to one another in the first direction d1, and the second sensing electrodes 322 may be electrically connected to one another in the second direction d2. It is, however, to be understood that the invention is not limited thereto. The first sensing electrodes 321 may be electrically connected to one another in the second direction d2 and the second sensing electrodes 322 may be electrically connected to one another in the first direction d1. The first sensing electrodes 321 and the second sensing electrodes 322 are spaced apart and isolated from one another.

The first wiring layer 320 includes first connection wirings 323 connecting the first sensing electrodes 321 to one another. The first sensing electrodes 321 adjacent to one another in the first direction d1 are physically connected through the first connection wirings 323. The width of the first connection wirings 323 may be smaller than the width of the first sensing electrodes 321.

The second sensing electrodes 322 adjacent to one another in the second direction d2 in the first wiring layer 320 are physically separated.

The first wiring layer 320 may include a touch driving wiring 324 and a touch wiring pad PD. The touch driving wiring 324 is connected to the first sensing electrodes 321 or the second sensing electrodes 322 and extends toward the pad to form the touch wiring pad PD. The touch wiring pad PD may have, but is not limited to, a somewhat extended shape than the touch driving wiring 324 for connection with the touch printed circuit board.

The first wiring layer 320 may be made of a conductive material. For example, the first wiring layer 320 may be made of a material including a transparent conductive oxide such as ITO (indium tin oxide), IZO (indium zinc oxide), ZnO (zinc oxide) or ITZO (indium tin zinc oxide); a metal material such as molybdenum, silver, titanium, copper, aluminum and an alloy thereof, a conductive polymer such as PEDOT, metal nanowires, carbon nanotubes, graphene, etc. When the first wiring layer 320 includes an opaque material, the first sensing electrodes 321 and the second sensing electrodes 322 may have a mesh shape.

A first insulating layer 330 is disposed on the first wiring layer 320. The first insulating layer 330 may be disposed over the entire surface of the encapsulation layer 116. The first insulating layer 330 may include contact holes 331 exposing the second sensing electrodes 322.

A second wiring layer 340 is disposed on the first insulating layer 330. The second wiring layer 340 includes second connection wirings. The second connection wirings of the second wiring layer 340 electrically connect the neighboring second sensing electrodes 322. The width of the second connection wirings of the second wiring layer 340 may be smaller than the width of the second sensing electrodes 322. The second connection wiring of the second wiring layer 340 is electrically connected to the second sensing electrode 322 through the contact hole 331. Although the second sensing electrodes 322 adjacent to each other are connected through a second connection wiring, they may be connected through a plurality of second connection wirings.

The second wiring layer 340 may be made of the above-listed materials for the first wiring layer 320. In an exemplary embodiment, the first wiring layer 320 including the first sensing electrodes 321 and the second sensing electrodes 322 having a relatively large area may be made of a transparent conductive oxide, and the second wiring layer 340 including the second connection wirings may be made of a metal material having a relatively low resistance such as molybdenum, silver, titanium, copper, aluminum, or an alloy thereof.

A second insulating layer 350 is disposed on the second wiring layer 340. The second insulating layer 350 covers the second wiring layer 340 to protect it. The second insulating layer 350 may be disposed over the entire surface of the encapsulation layer 116.

Each of the first insulating layer 330 and the second insulating layer 350 may be made up of a single layer or multiple layers. In addition, each of the first insulating layer 330 and the second insulating layer 350 may include an inorganic material, an organic material, or a composite material. In an exemplary embodiment, the first insulating layer 330 and/or the second insulating layer 350 may include an inorganic layer. The inorganic layer may include at least one of aluminum oxide, titanium oxide, silicon oxide, silicon oxynitride, zirconium oxide, and hafnium oxide.

In another exemplary embodiment, the first insulating layer 330 and/or the second insulating layer 350 may include an organic layer. The organic layer may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The second insulating layer 350 may be a planarization film or a passivation film. The second insulating layer 350 may include a substantially flat upper surface so that the black matrix 140 and the color filters 161_R, 161_G, and 161_B are stacked thereon.

The black matrix 140 including openings may be disposed on the second insulating layer 350. The plurality of color filters 161_R, 161_G and 161_B having color pattern of protrusions PT1 formed on the upper surfaces may be disposed in the openings of the black matrix 140.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting diode display device comprising:
    a substrate having a plurality of pixels;
    first electrodes disposed on the substrate, each of which is connected to a respective one of the pixels;
    organic emissive layers disposed on the first electrodes;
    a second electrode disposed on the organic emissive layers;
    a touch sensing unit disposed on the second electrode and including a touch electrode layer and an insulating layer covering the touch electrode layer; and
    color filters disposed on the touch sensing unit, each of which is disposed above a respective organic emissive layer wherein the color filters include upper and lower surfaces, at least one of which is uneven, and an upper surface of the insulating layer comprises an uneven pattern that contacts with lower surfaces of the color filters.

2. The organic light-emitting diode display device of claim 1, wherein the color filters have upper uneven surfaces comprising concave portions and convex portions.

3. The organic light-emitting diode display device of claim 2, wherein the concave portions are at the same level with respect to reference surface of the color filters, and wherein the convex portions protrude from the reference surface of the color filters in a thickness direction.

4. The organic light-emitting diode display device of claim 3, wherein the uneven surfaces comprise patterns of islands separated from one another, and wherein each of the island patterns has a dot shape.

5. The organic light-emitting diode display device of claim 2, wherein the uneven surfaces comprise one or more closed shapes.

6. The organic light-emitting diode display device of claim 2, wherein the convex portions are at the same level with respect to a reference surface of the color filters, and
wherein the concave portions are recessed from the reference surface of the color filters in a thickness direction.

7. The organic light-emitting diode display device of claim 1, further comprising:
at least one uneven color pattern disposed on upper surfaces of the color filters,
wherein the upper surfaces of the color filters comprise first portions in which the uneven color pattern is disposed, and second portions that are exposed and substantially flat.

8. The organic light-emitting diode display device of claim 1, further comprising:
a black matrix disposed along boundaries between the color filters,
wherein the touch electrode layer having a metal mesh, and wherein the metal mesh overlaps with the black matrix in a thickness direction.

9. The organic light-emitting diode display device of claim 1, wherein the color filters are disposed directly on the touch electrode layer.

10. The organic light-emitting diode display device of claim 9, wherein upper surfaces of the color filters are uneven.

11. The organic light-emitting diode display device of claim 1, further comprising:
an encapsulation layer disposed on the second electrode,
wherein the touch sensing unit comprises a touch electrode layer disposed directly on the encapsulation layer.

12. The organic light-emitting diode display device of claim 1, further comprising:
an encapsulation layer disposed on the second electrode; and an insulating layer disposed on the encapsulation layer,
wherein the touch sensing unit comprises a touch electrode layer disposed directly on the insulating layer.

13. The organic light-emitting diode display device of claim 1, wherein the second electrode comprises concave portions, convex portions protruding upward from the concave portions, and inclined portions connecting the concave portions with the convex portions.

14. The organic light emitting diode display according to claim 13, further comprising: a protective layer disposed between the substrate and the first electrodes and having concave portions and convex portions on an upper surface thereof.

15. The organic light-emitting diode display device of claim 14, wherein the concave portions, the convex portions and the inclined portions of the second electrode have substantially the same thicknesses.

16. An organic light-emitting diode display device comprising:
a substrate;
first electrodes disposed on the substrate;
second electrodes including concave portions, convex portions protruding upward from the concave portions, and inclined portions connecting the concave portions with the convex portions;
an organic light-emitting element disposed on the substrate;
an insulating layer covering the organic light-emitting element;
a touch electrode layer disposed on the insulating layer;
color filters covering the touch electrode layer, wherein the color filters contact the touch electrode layer and comprise a pattern of protrusions or recesses on at least one surface thereof; and
a protective layer disposed between the substrate and the first electrodes and having concave portions and convex portions on an upper surface thereof.

17. The organic light-emitting diode display device of claim 16, wherein the concave portions, the convex portions and the inclined portions of the second electrode have substantially the same thicknesses.

18. An organic light-emitting diode display device comprising:
a substrate having a plurality of pixels;
first electrodes disposed on the substrate, each of which is connected to a respective one of the pixels;
organic emissive layers disposed on the first electrodes;
second electrodes disposed on the organic emissive layers and including concave portions, convex portions protruding upward from the concave portions, and inclined portions connecting the concave portions with the convex portions;
a touch sensing unit disposed on the second electrode;
color filters disposed on the touch sensing unit, each of which is disposed above a respective organic emissive layer; and
a protective layer disposed between the substrate and the first electrodes and having concave portions and convex portions on an upper surface thereof.

19. The organic light-emitting diode display device of claim 18, wherein the concave portions, the convex portions and the inclined portions of the second electrode have substantially the same thicknesses.

* * * * *